(12) United States Patent
Kozuru et al.

(10) Patent No.: US 11,967,803 B2
(45) Date of Patent: Apr. 23, 2024

(54) METHOD OF MANUFACTURING LIGHT EMITTING MODULE, LIGHT EMITTING MODULE, AND PROJECTOR

(71) Applicant: NICHIA CORPORATION, Anan (JP)

(72) Inventors: Kazuma Kozuru, Tokushima (JP); Takuya Hashimoto, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/985,997

(22) Filed: Nov. 14, 2022

(65) Prior Publication Data

US 2023/0071897 A1 Mar. 9, 2023

Related U.S. Application Data

(63) Continuation of application No. 16/710,186, filed on Dec. 11, 2019, now Pat. No. 11,545,813.

(30) Foreign Application Priority Data

Dec. 12, 2018 (JP) .................................. 2018-233002
Sep. 11, 2019 (JP) .................................. 2019-165712

(51) Int. Cl.
*H01S 5/40* (2006.01)
*G03B 21/20* (2006.01)
(Continued)

(52) U.S. Cl.
CPC ........ *H01S 5/4087* (2013.01); *G03B 21/2013* (2013.01); *G03B 21/2033* (2013.01);
(Continued)

(58) Field of Classification Search
CPC ...... H01S 5/4087; H01S 5/023; H01S 5/0233; H01S 5/0235; G03B 21/2013; G03B 21/2033
See application file for complete search history.

(56) References Cited

U.S. PATENT DOCUMENTS 8,283,681 B2   10/2012  Sakamoto et al.
RE49,645 E      9/2023  Miura et al.
(Continued)

FOREIGN PATENT DOCUMENTS

CN   106481993 A   3/2017
EP   2 779 238 A1  9/2014
(Continued)

OTHER PUBLICATIONS

Non-Final Office Action on U.S. Appl. No. 16/710,186 dated May 17, 2022.
(Continued)

*Primary Examiner* — Yuanda Zhang
(74) *Attorney, Agent, or Firm* — Foley & Lardner LLP

(57) ABSTRACT

A light emitting module includes: a first light emitting device including: a first package, a plurality of first semiconductor laser elements mounted in the first package, and a first lens member having lens portions, a number of the lens portion is the same as a number of the first semiconductor laser elements; and a second light emitting device including: a second package, a plurality of second semiconductor laser elements mounted in the second package, wherein a quantity of the second semiconductor laser elements is fewer than a quantity of the first semiconductor laser elements, and a second lens member which is structured the same as the first lens member; and one or more mounting substrates in which the first light emitting device and the second light emitting device are mounted.

8 Claims, 23 Drawing Sheets

(51) Int. Cl.
- *H01S 5/023* (2021.01)
- *H01S 5/0233* (2021.01)
- *H01S 5/0235* (2021.01)
- *H01S 5/0237* (2021.01)
- *H01S 5/02253* (2021.01)
- *H01S 5/02255* (2021.01)
- *H01S 5/02257* (2021.01)
- *H01S 5/02325* (2021.01)

(52) U.S. Cl.
CPC ............ *H01S 5/023* (2021.01); *H01S 5/0233* (2021.01); *H01S 5/0235* (2021.01); *H01S 5/0237* (2021.01); *H01S 5/4093* (2013.01); *H01S 5/02253* (2021.01); *H01S 5/02255* (2021.01); *H01S 5/02257* (2021.01); *H01S 5/02325* (2021.01)

(56) References Cited

U.S. PATENT DOCUMENTS

| | | |
|---|---|---|
| 2005/0052378 A1 | 3/2005 | Hacker |
| 2009/0236618 A1 | 9/2009 | Yasuda |
| 2016/0004123 A1* | 1/2016 | Tanabe ............... G02F 1/133611 362/97.3 |
| 2016/0141831 A1 | 5/2016 | Li et al. |
| 2017/0059097 A1 | 3/2017 | Kataoka |
| 2017/0317467 A1* | 11/2017 | Miura .................. H01S 5/4031 |
| 2017/0338628 A1 | 11/2017 | Matsushita et al. |
| 2019/0019925 A1 | 1/2019 | Morita |
| 2023/0108294 A1 | 4/2023 | Enomoto et al. |

FOREIGN PATENT DOCUMENTS

| | | |
|---|---|---|
| JP | 2005-057272 A | 3/2005 |
| JP | 2007-227422 A | 9/2007 |
| JP | 2014-003009 A | 1/2014 |
| JP | 2014-007145 A | 1/2014 |
| JP | 2017-050080 A | 3/2017 |
| JP | 2017-050104 A | 3/2017 |
| JP | 2017-050106 A | 3/2017 |
| JP | 2017-050108 A | 3/2017 |
| JP | 2017-050342 A | 3/2017 |
| JP | 2017-050343 A | 3/2017 |
| JP | 2017-050344 A | 3/2017 |
| JP | 2017-050345 A | 3/2017 |
| JP | 2017-050356 A | 3/2017 |
| JP | 2017-201684 A | 11/2017 |
| JP | 2018-032706 A | 3/2018 |
| KR | 101475875 B1 | 1/2015 |
| WO | WO-2008/087868 A1 | 7/2008 |
| WO | WO-2013/088790 A1 | 6/2013 |
| WO | WO-2017/209149 A1 | 12/2017 |

OTHER PUBLICATIONS

Non-Final Office Action in U.S. Appl. No. 18/097,127 dated Jun. 12, 2023.

Non-Final Office Action in U.S. Appl. No. 96/000,426 dated May 26, 2023.

Restriction Requirement on U.S. Appl. No. 16/710,186 dated Dec. 20, 2021.

* cited by examiner

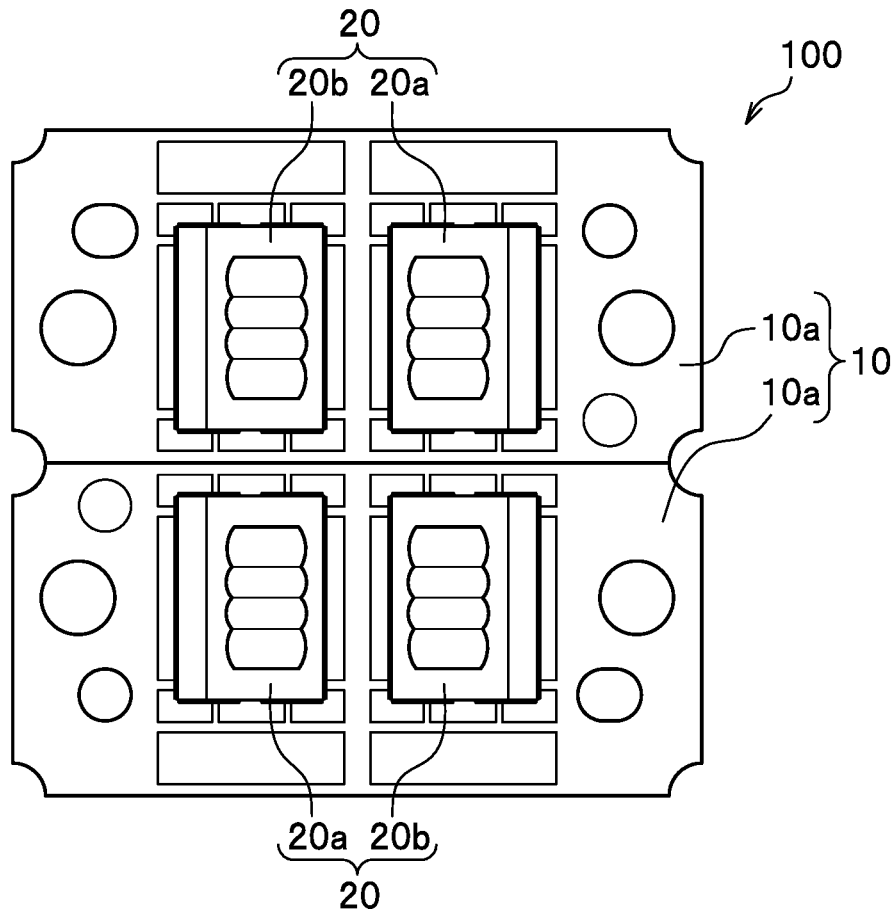
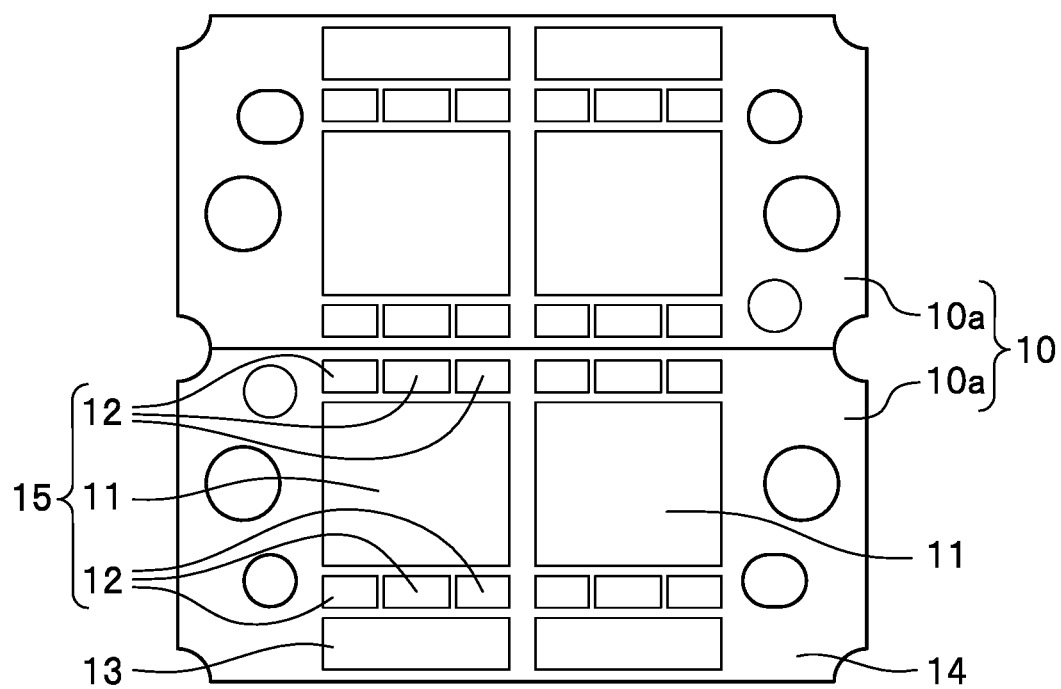

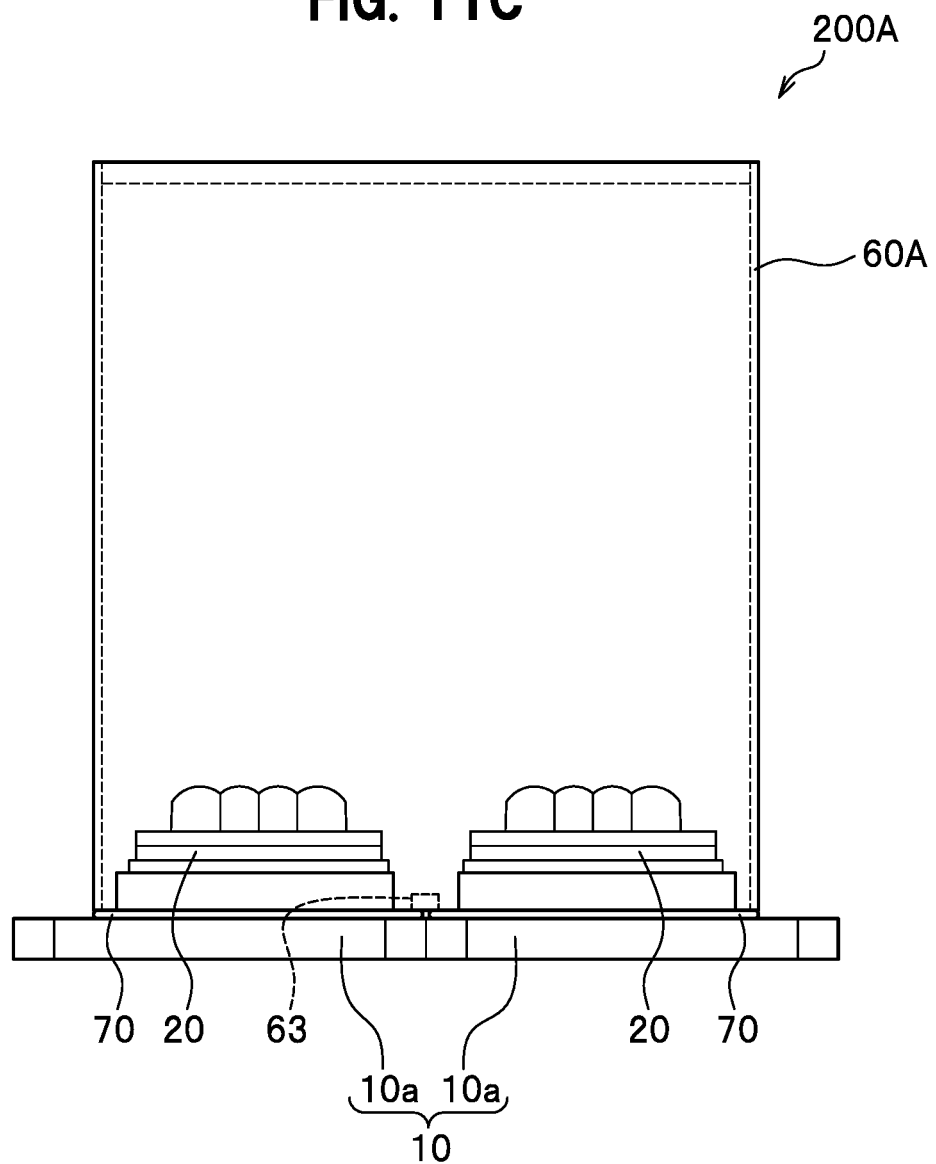

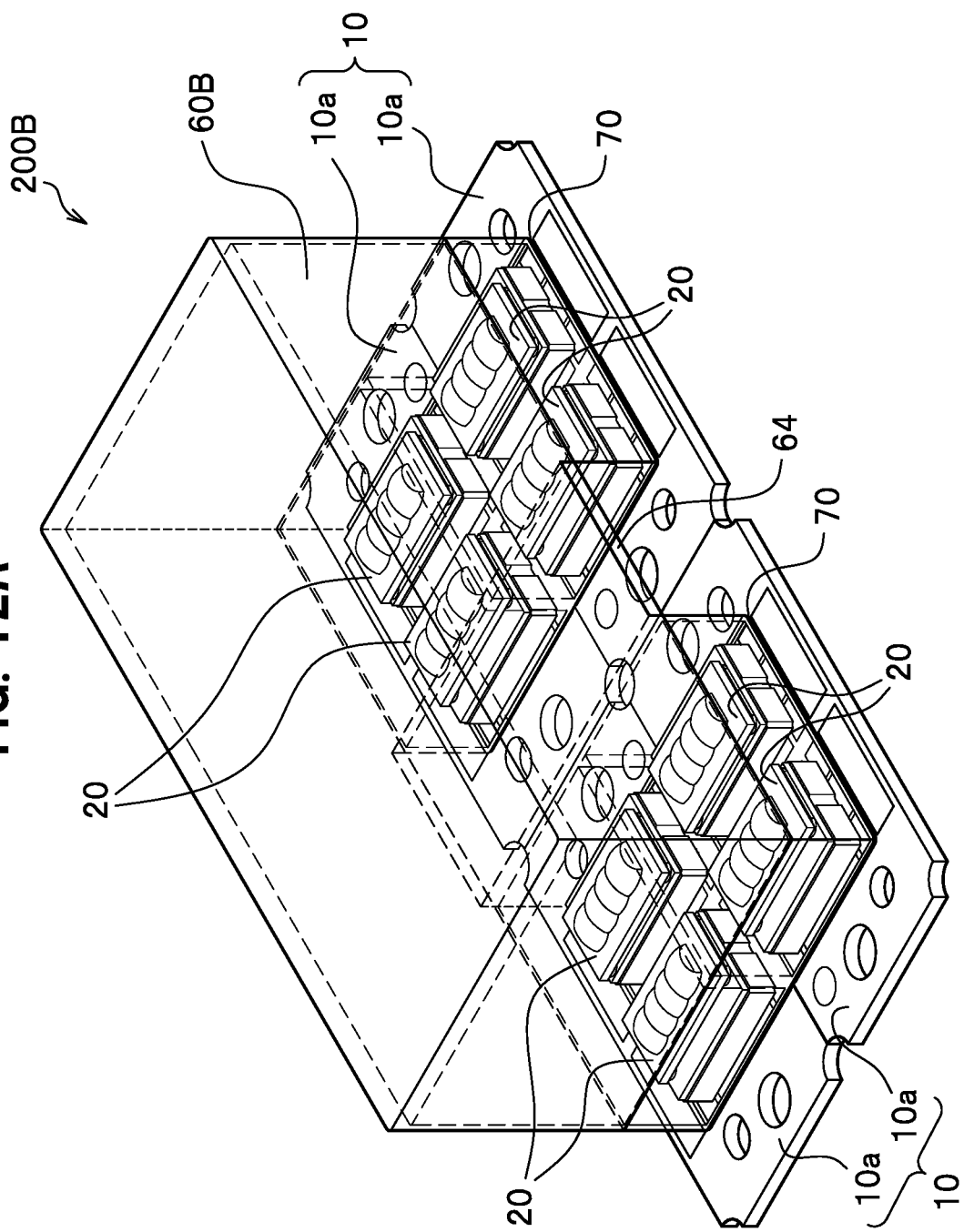

METHOD OF MANUFACTURING LIGHT EMITTING MODULE, LIGHT EMITTING MODULE, AND PROJECTOR

CROSS-REFERENCE TO RELATED APPLICATION

This application is a continuation of U.S. patent application Ser. No. 16/710,186, filed on Dec. 11, 2019, which claims priority to Japanese Patent Application No. 2018-233002 filed on Dec. 12, 2018, and Japanese Patent Application No. 2019-165712 filed on Sep. 11, 2019. The disclosures of these applications are hereby incorporated by reference in their entireties.

BACKGROUND

The present disclosure relates to a method of manufacturing a light emitting module, a light emitting module, and a projector.

There has been developed a light emitting module in which a light emitting device includes a plurality of light emitting elements mounted in one package on one mounting substrate. Japanese Patent Publication No. 2007-227422 discloses an optical unit, in which a plurality of semiconductor devices, each including four semiconductor elements, are mounted in one package on a unit substrate.

Light output demanded of light emitting modules varies depending on the intended use or size of an applied product. In order to flexibly provide the demanded light output, the number of light emitting elements mounted on the product can be adjusted. Still, there is room for improvement in efficiently responding to various required product specifications to provide demanded light output.

SUMMARY

An object of certain embodiments of the present disclosure is to provide a method of manufacturing a light emitting module efficiently meeting various product specifications in relation to light output.

Other object of certain embodiment of the present disclosure is to provide a light emitting module in a suitable configuration in which the number of mounted light emitting elements is adjusted.

According to one embodiment, a method of manufacturing a light emitting module including one or more light emitting devices in which a plurality of light emitting elements is mounted is provided. The method includes: providing a plurality of light emitting devices including one or more first light emitting devices and one or more second light emitting devices, wherein a number of the light emitting elements mounted in the first light emitting device is different by one from a number of the light emitting elements mounted in the second light emitting device; providing a first mounting substrate having a mounting surface provided with a plurality of connection patterns having the same pattern, each of the connection patterns corresponding to a respective one of the light emitting devices; and mounting the plurality of light emitting devices, selected from the one or more first light emitting devices and the one or more second light emitting devices, on the connection patterns. In the step of mounting the plurality of light emitting devices, the first mounting substrate is able to accommodate selection of the light emitting devices to be mounted so that a total number of the light emitting elements in the light emitting module is any number selected from at least three continuous numbers. The light emitting modules manufactured by the method includes a first light emitting module and a second light emitting module in which a total number of the light emitting elements is greater by one than a total number of the light emitting elements in the first light emitting module.

According to one embodiment, a method of manufacturing a light emitting module including one or more light emitting devices in which a plurality of light emitting elements is mounted is provided. The method includes: providing a plurality of light emitting devices including one or more first light emitting devices and one or more second light emitting devices, wherein a number of the light emitting elements mounted in the first light emitting device is different by one from a number of the light emitting elements mounted in the second light emitting device; providing a first mounting substrate having a mounting surface provided with a plurality of connection patterns having identical patterns, each of the connection patterns corresponding to a respective one of the light emitting devices; mounting at least one of the first light emitting devices on a first of the plurality of connection patterns; and mounting at least one of the second light emitting devices on the second of the plurality of connection patterns.

According to another embodiment, a light emitting module includes: a first light emitting device in which a plurality of light emitting elements are mounted; a second light emitting device in which a plurality of light emitting elements are mounted greater, wherein a number of the light emitting elements mounted in the second light emitting device is greater by one than a number of the light emitting elements mounted in the first light emitting device; and a first mounting substrate having a mounting surface provided with a plurality of connection patterns having the same pattern. The first light emitting device is mounted on a first of the connection patterns, and the second light emitting device is mounted on the second connection pattern.

The method of manufacturing a light emitting module according to an embodiment of the present disclosure can efficiently meet various product specifications. The light emitting module according to an embodiment of the present disclosure can provide a suitable configuration in which the number of mounted light emitting elements is adjustable.

BRIEF DESCRIPTION OF THE DRAWINGS

FIG. 1B is a top view schematically showing an exemplary configuration of the light emitting module according to the first embodiment.

FIG. 1C is a top view schematically showing an exemplary configuration of a mounting substrate according to the first embodiment.

FIG. 11C is a side view schematically showing an exemplary configuration of the projector according to the embodiment shown in FIG. 11A.

FIG. 12A is a perspective view schematically showing an exemplary application of a light emitting module according to certain embodiment to a projector.

DETAILED DESCRIPTION

Figure 1A:
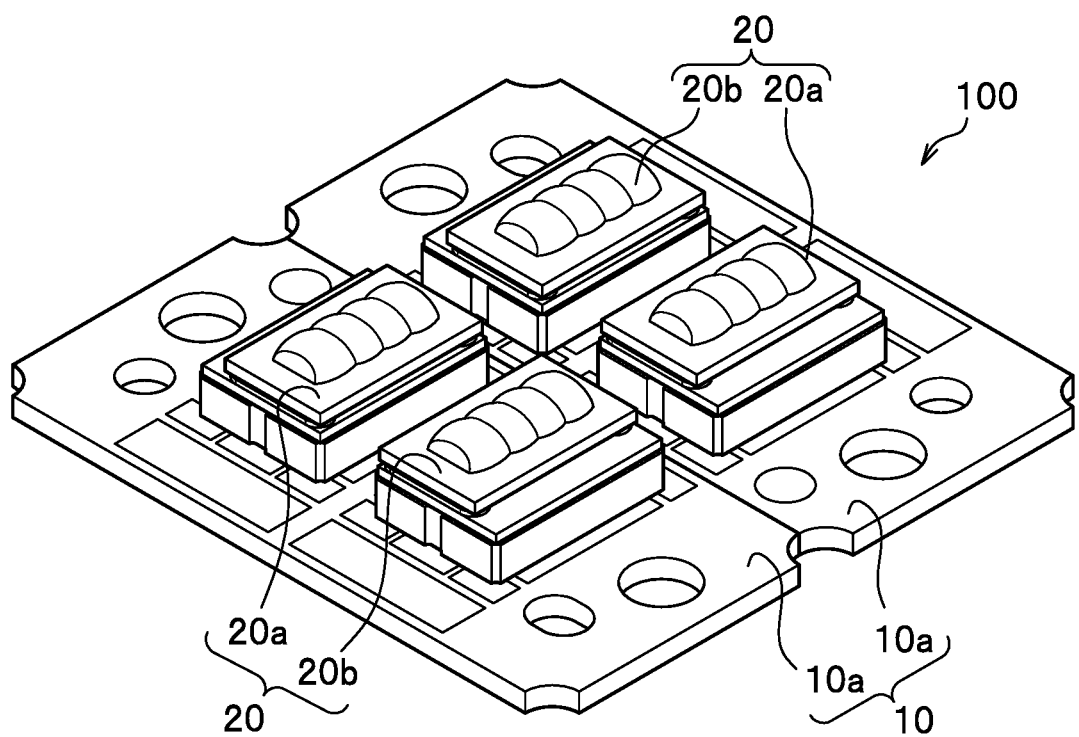
FIG. 1A is a perspective view schematically showing an exemplary configuration of a light emitting module according to a first embodiment.

In the following, a description will be given of embodiments with reference to the drawings. The embodiments described below are merely examples show a light emitting module and a method of manufacturing a light emitting module embodying the technical ideas of the present disclosure, but the scope of the invention is not limited to the described embodiments. The dimension, material, shape and relative disposition and the like of constituent components described in the embodiments are merely of an exemplary nature and not intended to limit the scope of the present disclosure thereto unless otherwise specified. The size, positional relationship and the like of members shown in the drawings may be exaggerated for the sake of clarity. In any of the embodiments, the same reference numerals denote a member the same or a similar to those described with reference to other embodiment, of which description may not be repetitively provided.

First Embodiment

Figure 1D:
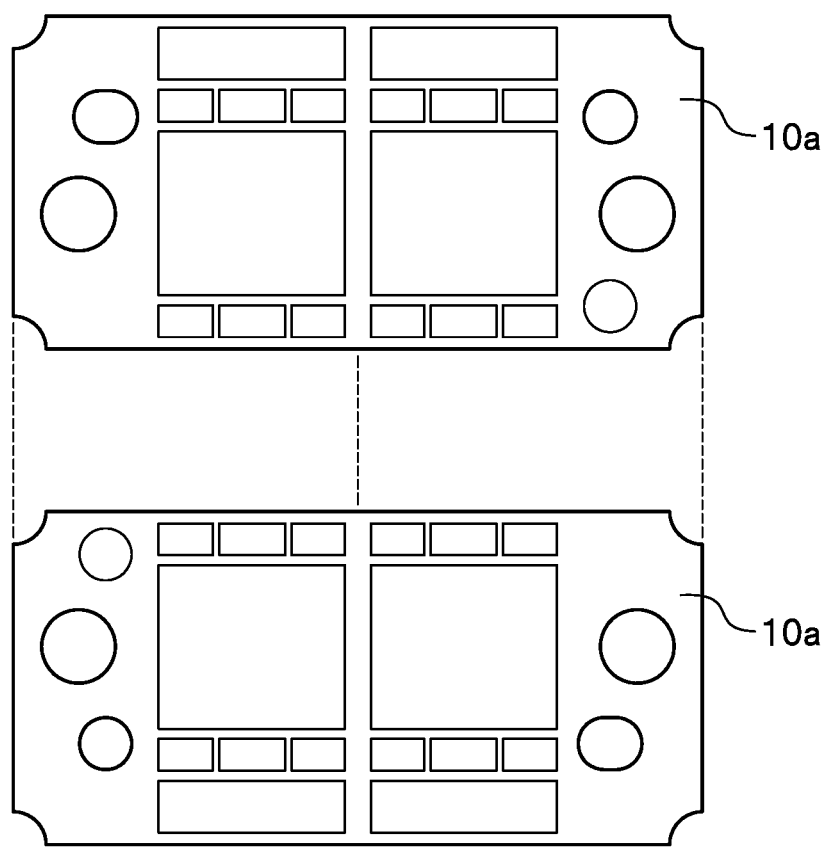
FIG. 1D is a top view in which the mounting substrate in FIG. 1C is split into two first mounting substrates.
Figure 2A:
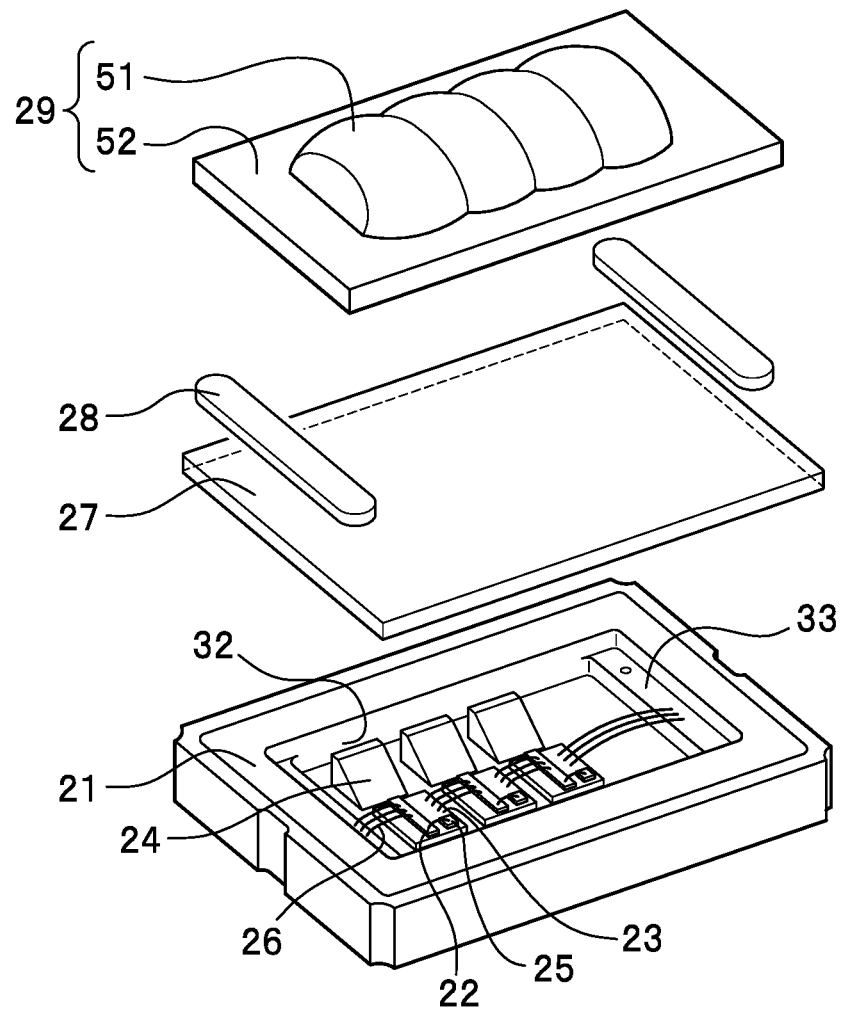
FIG. 2A is an exploded perspective view schematically showing a configuration of a first light emitting device.
Figure 2B:
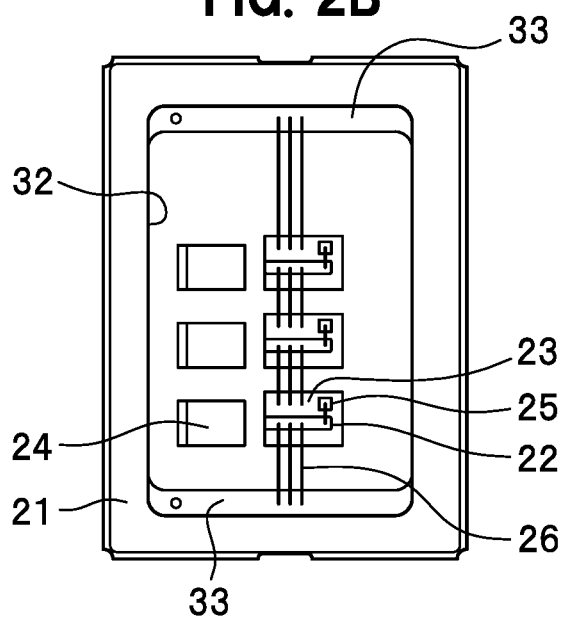
FIG. 2B is a plan view schematically showing a configuration inside a package of the first light emitting device.
Figure 3A:
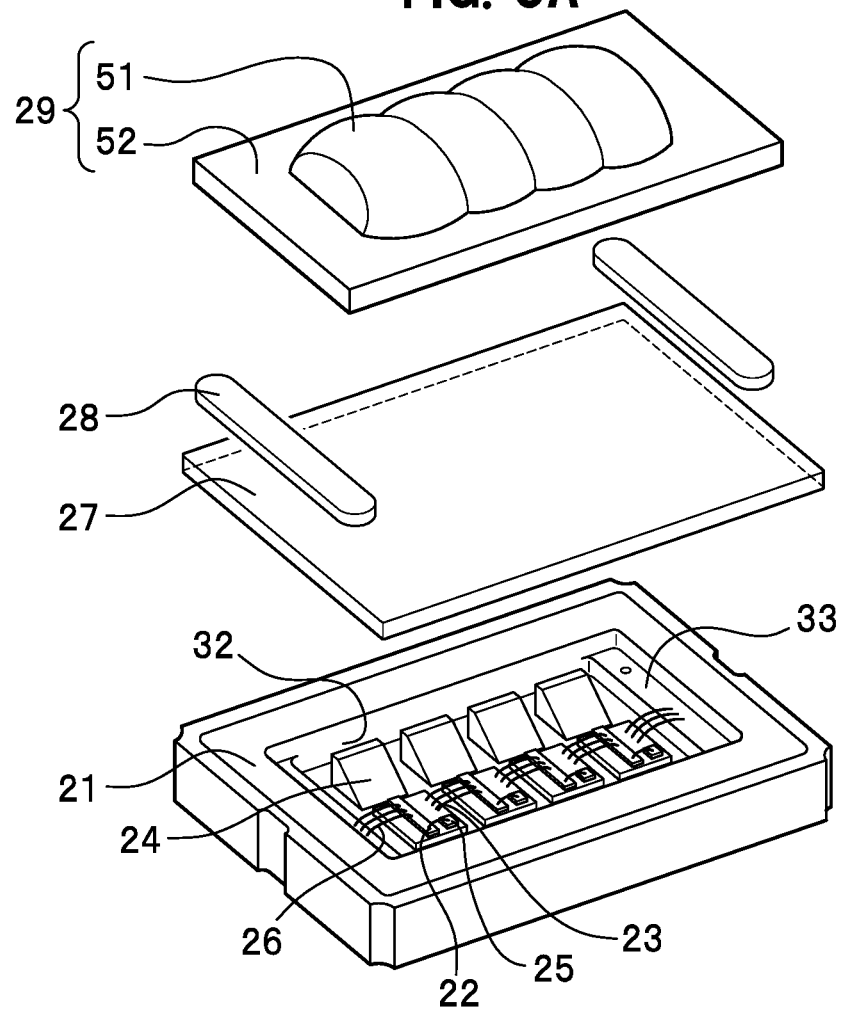
FIG. 3A is an exploded perspective view schematically showing a configuration of a second light emitting device.
Figure 3B:
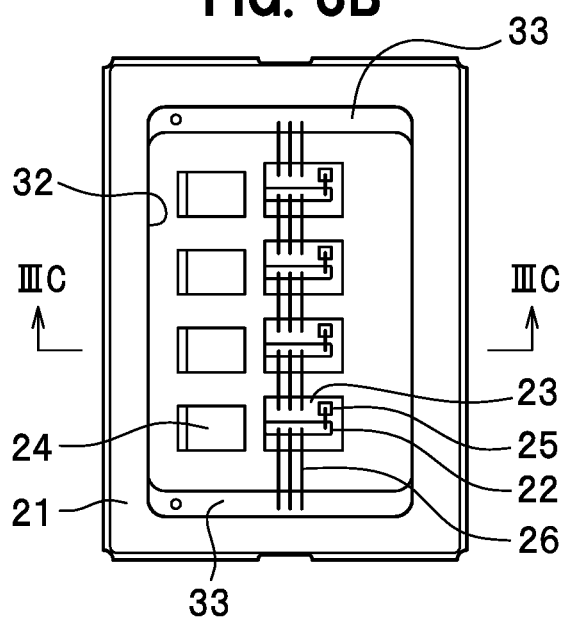
FIG. 3B is a plan view schematically showing a configuration inside a package of the second light emitting device.
Figure 3C:
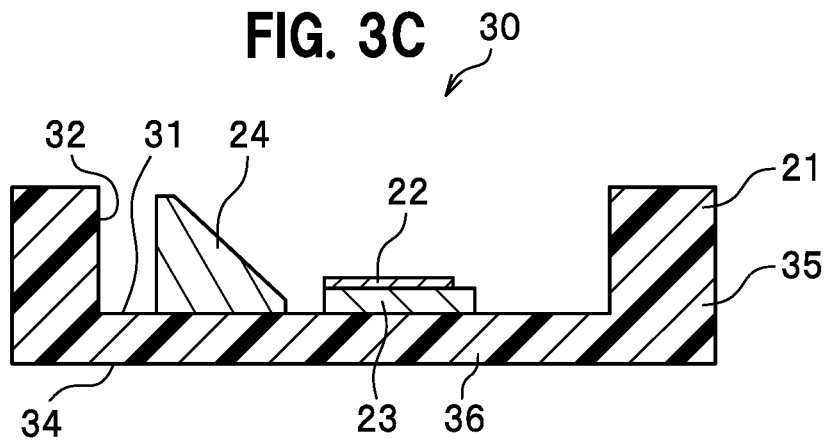
FIG. 3C is a cross-sectional view taken along line IIIC-IIIC in FIG. 3B.
Figure 3D:
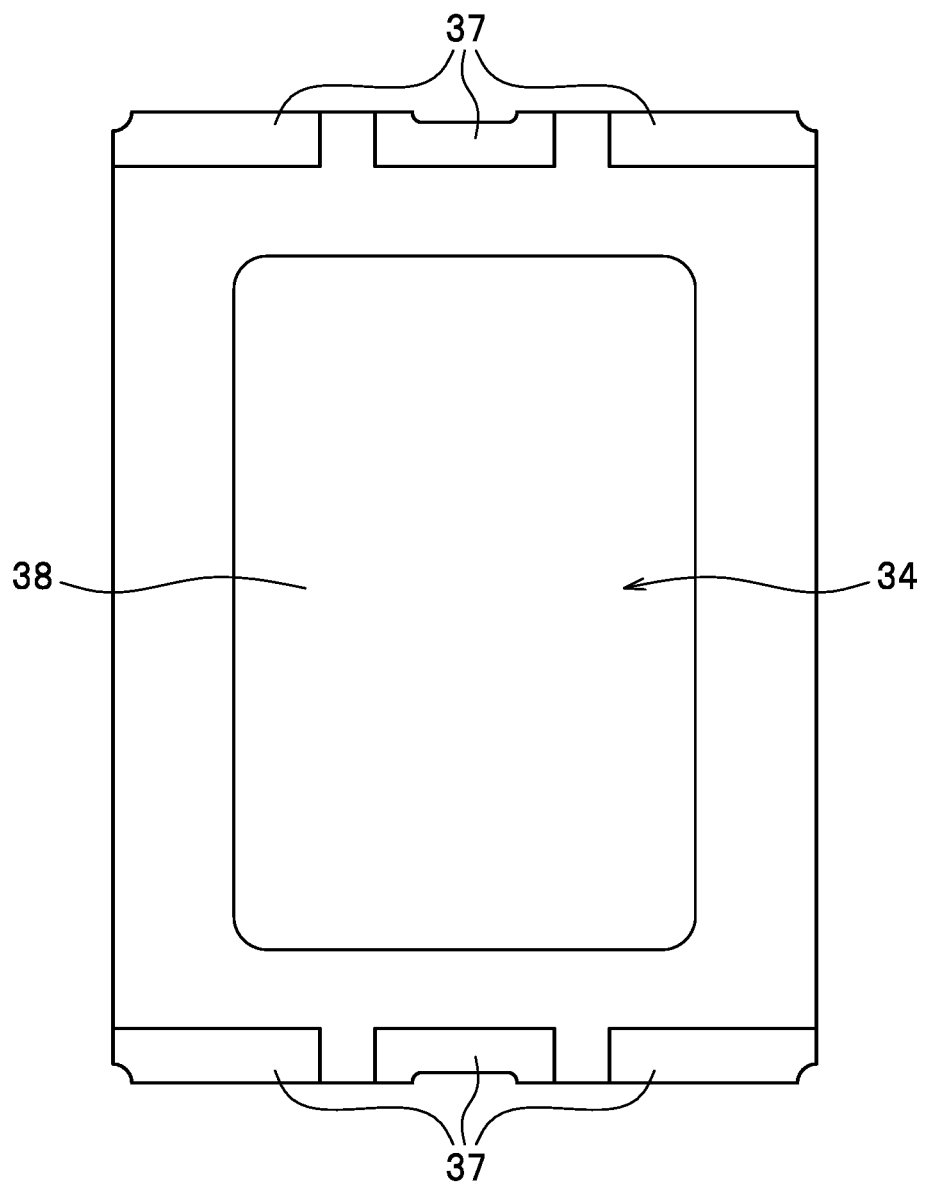
FIG. 3D is a bottom view schematically showing a configuration of a lower surface of the second light emitting device.

FIG. 1A is a perspective view schematically showing an exemplary configuration of a light emitting module according to a first embodiment. FIG. 1B is a top view schematically showing an exemplary configuration of the light emitting module of the first embodiment. FIG. 1C is a top view schematically showing an exemplary configuration of the mounting substrate according to the first embodiment. FIG. 1D is a top view in which the mounting substrate in FIG. 1C is split into two first mounting substrates. FIG. 2A is an exploded perspective view schematically showing a configuration of a first light emitting device. FIG. 2B is a top view schematically showing a configuration inside a package of the first light emitting device. FIG. 3A is an exploded perspective view schematically showing a configuration of a second light emitting device. FIG. 3B is a plan view schematically showing a configuration inside a package of the second light emitting device. FIG. 3C is a cross-sectional view taken along line IIIC-IIIC in FIG. 3B. FIG. 3D is a bottom view schematically showing a configuration of a lower surface of the second light emitting device.

Light Emitting Module

A light emitting module 100 is equipped with one of: a first light emitting device 20a in which three light emitting elements 22 are mounted; and a second light emitting device 20b in which the light emitting elements 22 are mounted greater by one in number than in the first light emitting device 20a, that is, four light emitting elements 22 are mounted. The light emitting module 100 further includes a first mounting substrate 10a provided with two connection patterns 15 on its mounting surface. The connection patterns 15 are usable for both of the first light emitting device 20a and the second light emitting device 20b. To the two connection patterns 15 provided at the mounting surface of the first mounting substrate 10a, desired light emitting devices 20 selected out of the first light emitting device 20a and the second light emitting device 20b are connected. Specifically, connection is performed in a combination of two first light emitting devices 20a, a combination of two second light emitting devices 20b, or a combination of one first light emitting device 20a and one second light emitting device 20b. The mounting substrate 10 can be formed of one first mounting substrate 10a or two first mounting substrates 10a next to each other.

In one of the two first mounting substrates 10a forming the mounting substrate 10 formed of two neighboring first mounting substrates 10a, to one of the two first mounting substrates 10a, there are some cases in which only one light emitting device and two light emitting devices selected from the first light emitting device 20a and the second light emitting device 20b can be connected. The light emitting module 100 can also include the mounting substrate 10 configuring as one first mounting substrate 10a, to which selected only one of the first light emitting device 20a and the second light emitting device 20b is connected.

In FIG. 1A to 1D, the light emitting module 100 includes the mounting substrate 10 formed of two neighboring first mounting substrates 10a. The two connection patterns 15 of each first mounting substrate 10a are connected to one first light emitting device 20a and one second light emitting device 20b by bonding.

In the following, a description will be given of the configuration of the light emitting module 100.

The light emitting module 100 includes the mounting substrate 10 and the light emitting device 20.

Mounting Substrate

The mounting substrate 10 is formed of one first mounting substrate 10a, or two first mounting substrates 10a of an identical configuration. In FIG. 1C, the mounting substrate 10 includes two neighboring first mounting substrates 10a.

Each first mounting substrate 10a includes a lower surface, an upper surface, and lateral surfaces. On the upper surface, connection patterns 15 each formed of a metal part 11 and first metal films 12, second metal films 13, and an insulating film 14 are formed.

The first mounting substrate 10a has the upper surface serving as a mounting surface including two connection patterns 15. One light emitting device 20 is mounted on one connection pattern 15. Therefore, two light emitting devices 20 can be mounted on the first mounting substrate 10a. Providing identical two connection patterns 15 on the first mounting substrate 10a can facilitate formation of the connection patterns at the first mounting substrate 10a. More than two of the connection patterns 15 can be provided. For example, three connection patterns 15 can be provided in line. A plurality of connection patterns 15 are provided for each first mounting substrate 10a. Each connection pattern 15 includes the metal part 11 and the first metal films 12. The metal part 11 is exposed from the insulating film 14, in other words, passes through the first mounting surface 10a from the upper surface to the lower surface. The first metal films 12 are formed on the insulating film 14. Thus, the metal part 11 and the first metal films 12 serve as the mounting surface for a light emitting device. The metal part 11 can be a metal film formed at the upper surface. For example, similarly to the first metal films 12, a metal film can be formed on the insulating film 14 as the metal part 11.

The metal part 11 is a portion where the light emitting device 20 is mounted, and has a quadrangular shape as seen in a top view. Two metal parts 11 are next to each other in the lateral direction. The metal part 11 is a part in which a base part of the mounting substrate is exposed and no portion of the insulating film 14 exists on the upper surface of the first mounting substrate 10a. is a surface in which the substrate is exposed with no portion where insulating film 14 exists. The metal part 11 can be formed of a plurality of metal layers. For example, the metal part 11 as a plurality of metal layers can be formed by a metal layer provided at a portion of the substrate to be the metal part 11 so as to be flush with the insulating film 14 positioned at the upper surface of the substrate or the first metal films 12.

The insulating film 14 is provided at the upper surface of the first mounting substrate 10a excluding portions where the metal parts 11 exist. The first metal films 12 and the second metal film 13 are provided on the insulating film 14.

The first metal films 12 are formed in three upper and lower pairs with reference to each metal part 11 as seen in a plan of the figure. The second metal film 13 is provided at the position closer to and along either the upper first metal films 12 or the lower first metal films 12. The second metal film 13 is not provided along the other first metal films 12. The second metal film 13 and one of the pairs of the first metal films 12 closer to the second metal film 13 are formed on the insulating film 14 by forming one metal film in which the first metal films 12 and the second metal film 13 are continued to each other, and forming the insulating film 14 on the upper surface of the first mounting substrate 10a to separate the first metal films 12 and the second metal film 13 thereon. That is, although it cannot be seen externally, the first metal films 12 and the second metal film 13 are continuous to each other and electrically connected to each other.

The other one of the pairs of the first metal films 12 farther from the second metal film 13 in one of the connection patterns 15 are continuous to the other one of the pairs of the first metal films 12 farther form the second metal film 13 in the other one of the connection patterns 15. That is, the three first metal films 12 are formed in a similar manner of forming a continuous metal film on the insulating film 14, and forming the insulating film 14 on the continuous metal film to separate three first metal films 12 on the upper surface of the first mounting substrate 10a in each connection pattern 15. Accordingly, two connection patterns 15 are connected to each other between the other-counterpart first metal films 12 in one of the connection patterns 15 and the other-counterpart first metal films 12 in the other one of the connection patterns 15, and electrically connected to each other therebetween. The metal part 11 is not continuous to the first metal films 12.

The first metal films 12 provided in upper and lower pairs with reference to the metal part 11 are connected to the metal film 37 provided at the lower surface of the light emitting device 20, to thereby establishing electrical connection of the pairs. By respectively mounting the two light emitting devices 20 on the two connection patterns 15, electrical connection from one second metal film 13 to other second metal film 13 is established through the two light emitting devices 20.

Thus, the first mounting substrate 10a and the light emitting device 20 can be electrically connected with each other. By virtue of the first metal films 12 separated in three portions in the first mounting substrate 10a, the self-aligning effect may effectively be exerted in mounting the light emitting device 20. When only one light emitting device 20 is mounted, electrical connection can be established from the other-counterpart first metal films 12 of the connection pattern 15 with no light emitting device mounted. Providing the second metal film 13 on only one side enables recognition of the mounting orientation by the position of the second metal film. The two first mounting substrates 10a in the mounting substrate 10 are next to each other having their lateral surfaces opposite to the lateral surfaces close to the second metal films 13 facing each other.

In the first mounting substrate 10a, outside the region where the two connection patterns 15 are next to each other, through holes passing through the substrate in thickness direction are provided on the right and left sides, defining that the first metal films 12 are arranged in upper and lower pairs with reference to the metal part 11. The through holes are provided for accommodating positioning pins and fixing screws.

Light Emitting Device

The light emitting device 20 includes the first light emitting device 20a and the second light emitting device 20b. The first light emitting device 20a and the second light emitting device 20b each include a package 21, semiconductor laser elements 22, submounts 23, light-reflective members 24, protective elements 25, wires 26, a lid member 27, adhesive parts 28, and a lens member 29.

The first light emitting device 20a and the second light emitting device 20b are identical to each other in outer shape and different from each other in the number of semiconductor laser elements 22 mounted inward of the outer shape. That is, the present embodiment employs the package 21 capable of accommodating four semiconductor laser elements 22 to be mounted for both of the first light emitting device 20a and the second light emitting device 20b. Accordingly, using the packages 21 having the same structure enables to produce the first light emitting device 20a on which three semiconductor laser elements 22 are mounted as shown in FIGS. 2A and 2B, and to produce the second light emitting device 20b on which four semiconductor laser elements 22 are mounted as shown in FIGS. 3A and 3B are manufactured. By virtue of the first light emitting device 20a and the second light emitting device 20b employing the package of identical structure, the first light emitting device 20a and the second light emitting device 20b are identical to each other in outer shape. Thus, inconvenience of size difference of the light emitting devices does not have to be taken into account regardless of which light emitting device is employed to be mounted on the mounting substrate. That is, the first mounting substrates 10a each having the same layout of a plurality of connection patterns can be provided. FIGS. 3C and 3D respectively show the cross section of the second light emitting device and the lower surface (i.e., the back surface) of the second light emitting device, which are similarly applicable to the first light emitting device. The number of semiconductor laser elements 22 mounted on the first light emitting device 20a is not limited to three. For example, it can be two, or four or more. Alternatively, it can be one. The semiconductor laser elements 22 mounted on the second light emitting device 20b is greater by one in number than the semiconductor laser elements 22 mounted on the first light emitting device 20a. The difference in the number of the semiconductor laser elements 22 can be greater by two.

The three semiconductor laser elements 22 in the first light emitting device 20a are disposed at identical positions to the three semiconductor laser elements 22 among the four semiconductor laser elements 22 in the second light emitting device 20b. Thus, the mount positions of the semiconductor laser elements 22 in the package 21 can be the same between the first light emitting device 20a and the second light emitting device 20b.

Which position where one of the four semiconductor laser elements 22 is absent can appropriately be determined. For example, the three semiconductor laser elements 22 in the first light emitting device 20a can be arranged in line densely on one side of the package 21. That is, the three semiconductor laser elements 22 in the first light emitting device 20a are arranged such that the semiconductor laser element 22 is absent at the end position. Thus, the first light emitting device 20a emits light in a smaller range. Alternatively, for example, the three semiconductor laser elements 22 in the first light emitting device 20a can be disposed so as to correspond to three out of four semiconductor laser elements 22 arranged in the second light emitting device 20b, in which one semiconductor laser element 22 is absent at any position other than the both end positions. This configuration can reduce the difference in the length of light emission region across the light emitting device between the first light emitting device 20a and the second light emitting device 20b. The arrangement of the present disclosure is not required thereto. For example, three semiconductor laser elements 22 can be evenly disposed in the region where four semiconductor laser elements 22 are to be arranged.

The package 21 has a quadrangular shape as seen in a top view, and a recess 30 having a quadrangular shape as seen in a top view is formed therein. The "quadrangular shape" in the present disclosure includes a shape having its corners or lateral surfaces partially removed as the package 21, or a substantially quadrangular shape having its corners rounded as the recess 30. In the package 21, step parts 33 are formed at part of the inner surface 32 of the recess 30. Specifically, the step parts 33 are formed at two inner surfaces 32 of opposing short sides among four inner surfaces 32 of the recess 30.

The main material of the package 21 can be ceramic. Not being limited to ceramic, the package 21 can be formed of metal. Examples of the ceramic as the main material of the package 21 include aluminum nitride, silicon nitride, aluminum oxide, or silicon carbide. The metal usable for the main material of the package 21 can be copper, aluminum, iron, or a composite such as copper molybdenum, a copper-diamond composite material, or copper-tungsten.

Metal films are provided on the lower surface 34 and the upper surface of each of the step parts 33 of the package 21. The metal films at the lower surface 34 of the package 21 include metal films 37 provided at the opposite ends of the package 21 to form pairs, and a metal film 38 provided at the center of the lower surface 34 of the package 21 between the metal films 37 at the opposite ends. The metal films 37 each having quadrangular shape are arranged at three portions along each of opposing two sides, while being spaced apart from each other. The metal films 37 are arranged to face the first metal films 12 of the first mounting substrate 10a so as to be connected thereto. The area of the metal film 38 provided at the center of the lower surface 34 of the package 21 is greater than any of the metal films 37. The metal film 38 is arranged to face the metal part 11 of the first mounting substrate 10a so as to be connected thereto. In the package 21, metal wirings wired inside electrically connect between the metal films on the upper surfaces of the step parts 33 and the metal films 37 at the lower surfaces 34.

In the package 21, a frame part 35 forming the frame of the recess 30 and the bottom part 36 can be formed of different main materials, and the package 21 can be formed by the frame part 35 and the bottom part 36 being joined to each other. For example, the bottom part 36 can have a plate-like shape of a predetermined thickness and of which main material is metal, and the frame part 35 can be a frame having a predetermined height and of which main material is ceramic. The package 21 can be formed by joining such the bottom part 36 and frame part 35 to each other. In this case, without the necessity of providing the metal film 38, the lower surface of the bottom part 36 is connected to the metal part 11 of the first mounting substrate 10a.

To the connection wirings, which are the metal films provided at the upper surfaces of the step part 33, the semiconductor laser elements 22 and the protective elements 25 are electrically connected. The wires 26 are bonded for establishing this connection. FIGS. 2B and 3B exemplarily show the bonding of the wires 26 in connecting the semiconductor laser elements 22 in series. The connection manner is not specified thereto. The plurality of semiconductor laser elements 22 can be connected in parallel. Thus, the semiconductor laser elements 22 and the protective elements 25 are electrically connected via the metal films 37 that are provided at the lower surface 34 of the package 21.

No step part 33 is provided at two opposite inner surfaces 32 in the longitudinal direction of the package 21. Providing the step parts 33 along not all the inner surfaces 32 can reduce the size of the package 21. The step part 33 can be provided at the inner surface 32 on the side far from the light-reflective members 24. Providing a greater area for the step parts 33 can ensure a greater area for wiring. On the other hand, no step part 33 can be provided at the inner surface 32 on the side closer to the light-reflective member 24. There is no advantage to provide a step part 33 on the side closer to the light-reflective member 24 because provision of a wiring for semiconductor laser elements 22 cannot be conveniently performed. Specifically, this is because the wires 26 have to be provided so as not to block optical path in connecting the semiconductor laser elements 22 to the wiring.

Providing no step part 33 at the inner latera surfaces 32 can bring the light-reflective member 24 closer to the outer lateral surface of the package 21. In the case in which the two light emitting devices 20 are mounted on the mounting substrate 10, distance between lights emitted from the two light emitting devices 20 can be closer, of which the details will be described later. As shown in FIGS. 2B and 3B, the lateral surface 32 closer to the light-reflective member 24 is the one of the inner lateral surfaces forward to the laser light traveling direction from the semiconductor laser element.

In the light emitting device 20, the pairs of metal films 37 at the lower surface 34 are connected to the first metal films 12 of the first mounting substrate 10a. The metal film 38 interposed between the pairs of metal films 37 is connected to the metal part 11 of the first mounting substrate 10a. The connection between the light emitting device 20 and the first mounting substrate 10a can be realized by soldering. In connecting the metal films 37 and the metal film 38 at the lower surface 34 of the light emitting device 20 to the first metal films 12 and the metal part 11 of the first mounting substrate 10a, the self-aligning effect in fixing the light emitting device 20 to the first mounting substrate 10a can be exerted.

Each of the semiconductor laser elements 22 has a lower surface, an upper surface, and lateral surfaces, and emit laser light from one lateral surface. The laser light emitted from each semiconductor laser element 22 spreads, to form an oval far field pattern (hereinafter referred to as the "FFP") in a plane parallel to the light emission end surface.

The semiconductor laser elements 22 are mounted on the bottom surface 31 (i.e., an upper surface of a bottom part) of the recess 30 of the package 21 respectively via the submounts 23. The submounts 23 are individually respectively provided for the semiconductor laser elements 22. Alternatively, in the light emitting device 20, a plurality of semiconductor laser elements 22 can be mounted on the upper surface of one submount 23. Furthermore, in the light emitting device 20, the semiconductor laser elements 22 can be directly mounted on the bottom surface 31 of the recess 30 of the package 21 without using the submounts 23.

As shown in FIGS. 2B and 3B or the like, the semiconductor laser elements 22 in the light emitting device 20 can be arranged in one direction. Specifically, the semiconductor laser elements 22 are arranged in the longitudinal direction of the package 21. Each of the mounted semiconductor laser elements 22 is oriented such that laser light emitted from the light emission end surface travels in the same direction. Position of each of the mounted semiconductor laser elements 22 is designed such that the light emission end surface is positioned on the same plane. It is not required to position the light emission end surfaces on the same plane.

The semiconductor laser elements 22 arranged in one direction are electrically connected in series by wires 26. The laser light emitted from the light emission end surface of each of the semiconductor laser elements 22 travels a direction perpendicular to the direction along which the semiconductor laser elements 22 are arranged.

The semiconductor laser elements 22 mounted on the first light emitting device 20a and the second light emitting device 20b are all semiconductor laser elements emitting blue-color light. The semiconductor laser elements 22 can be semiconductor laser elements emitting light in color other than blue, for example, red color or green color. The semiconductor laser elements 22 mounted on the first light emitting device 20a and the semiconductor laser elements 22 mounted on the second light emitting device 20b can be different from each other in color of emitted light. For example, the semiconductor laser elements 22 emitting blue light are mounted on the first light emitting device 20a, and the semiconductor laser elements 22 emitting red light are mounted on the second light emitting device 20b. There is a case in which two first light emitting devices 20a or two second light emitting devices 20b can be mounted on the first mounting substrate 10a by being connected to two connection patterns 15. In this case, the semiconductor laser elements 22 in one of the two light emitting devices 20 emit light with different color from the color of light emitted from the semiconductor laser elements 22 in the other one of the two light in which the semiconductor laser elements 22.

In the present disclosure, blue light refers to light of which peak emission wavelength is in a range of 420 nm to 494 nm. Red light refers to light of which peak emission wavelength is in a range of 605 nm to 750 nm. Green light refers to light of which peak emission wavelength is in a range of 495 nm to 570 nm inclusive.

The semiconductor laser elements 22 are exemplary light emitting elements mounted on the light emitting module of the present disclosure. The light emitting elements are not specified to the semiconductor laser elements 22.

The submounts 23 have their lower surfaces bonded to the bottom surface 31 of the recess 30 of the package 21, and have their upper surfaces bonded to the semiconductor laser elements 22. The semiconductor laser elements 22 are mounted on the submounts 23 such that the light emission end surfaces of the semiconductor laser elements 22 are aligned with or project from the lateral surfaces of the submounts 23. Accordingly, lights emitted from the semiconductor laser elements 22 are less likely to irradiate the upper surfaces of the submounts 23. The submounts 23 can be formed of, for example, silicon nitride, aluminum nitride, or silicon carbide. A metal film is provided at the upper surface of each submount 23.

The light-reflective members 24 reflect light from the semiconductor laser elements 22. The light-reflective members 24 are mounted on the bottom surface of the recess 30 of the package 21. The light-reflective members 24 are individually respectively provided for the semiconductor laser elements 22. On the three or four semiconductor laser elements 22, an identical distance is designed between the light emission end surfaces of respective semiconductor laser elements 22 and the corresponding light-reflective members 24. The distance can be determined for each semiconductor laser element 22 and can be changed among the plurality of semiconductor laser elements 22. In each light emitting device 20, one light-reflective member 24 can be disposed for a plurality of semiconductor laser elements 22.

Each of the light-reflective members 24 has a lower surface, an upper surface, lateral surfaces, and an inclined surface. The inclined surface functions as the light-reflective surface. The light-reflective surface is a flat surface and inclined from the upper surface to the lower surface. The light-reflective surface is designed to form an angle of 45 degrees relative to the lower surface. The angle is not specified to 45 degrees, and the light-reflective surface can be a curved surface instead of a flat surface.

Each of the light-reflective members 24 can have a base member formed of a main material and a light-reflective film can be formed at each region where the light-reflective surface is to be provided. The main material is preferably heat resistant, and can be, for example, glass such as quartz or BK7 (i.e., borosilicate glass), metal such as aluminum, or Si. The light-reflective film is preferably formed of a highly light-reflective material, and can be metal such as Ag or Al, a dielectric multilayer film such as $Ta_2O_5/SiO_2$, $TiO_2/SiO_2$, or $Nb_2O_5/SiO_2$. When the base member of each light-reflective member 24 is formed of a highly light-reflective main material such as metal, the light-reflective film does not have to be disposed.

The majority of light emitted from the semiconductor laser elements 22 irradiates the light-reflective surfaces of corresponding light-reflective members 24. The optical path length of light from the semiconductor laser element 22 to incident on a lens part can be greater by having the light-reflective member 24 interposed compared to the case in which no light-reflective members 24 are interposed therebetween. The greater optical path length can reduce influence of misalignment between the light-reflective members 24 and the semiconductor laser elements 22. The light emitting device 20 may not include the light-reflective members 24 and have the light emission end surfaces of the semiconductor laser elements 22 oriented upward.

The protective elements 25 are respectively mounted on the upper surfaces of the submounts 23. The protective elements 25 can be, for example, Zener diodes. The wires 26 can be metal wirings. The material of the wires 26 can be metal such as Au, Ag, Cu, Pt, or Al, or alloy of the foregoing metals. The light emitting devices 20 may not include the protective elements 25.

The lid member 27 covers the semiconductor laser elements 22 and the light-reflective members 24. The lid member 27 is light-transmissive as a whole, and can be partially opaque. The main material of the lid member 27 can be sapphire. The lid member 27 is partially provided with a metal film. The main material of the lid member 27 can be glass instead of sapphire, for example.

The lid member 27 has a lower surface bonded to the upper surface (i.e., the upper surface of the frame part) of the package 21. Each of the lid member 27 and the package 21 is provided with a metal film where they are bonded to each other, and fixed to each other with Au—Sn or the like. Closed space can be formed in the light emitting device 20 by the package 21 and the lid member 27 being bonded to each other. This closed space is hermetically sealed space. The light emitting device 20 being hermetically sealed in this manner avoids collection of any organic substance or the like at the light emission end surfaces of the semiconductor laser elements 22.

The adhesive parts 28 are formed at the upper surface of the lid member 27 where the lid member 27 and the lens member 29 are bonded to each other. The adhesive parts 28 can be, for example, UV-cured resin. The adhesive parts 28 are formed so as to avoid contact between the lid member 27 and the lens member 29. The position or height of the adhesive parts 28 can be adjusted by the thickness of the adhesive parts 28, in bonding the lens member 29 to the lid member 27. In order to avoid interference to the optical path of light emitted from the semiconductor laser elements 22, the adhesive parts 28 are formed, for example, at the position facing the outer edge of the lens member 29. While FIGS. 2A and 3A show an exemplary shape of the cured adhesive parts 28, the adhesive parts 28 can be soft when being applied.

The lens member 29 is provided so as to face the upper surface of the lid member 27. The lens member 29 is made up of lens parts 51 having lens shapes, and a quadrangular support plate part 52 supporting the lens part 51 being integrated with each other. In the lens member 29, the lens parts 51 are provided so as to respectively face to the optical axes of the semiconductor laser elements 22. The lens parts 51 are disposed and shaped so that light beams emitted from the corresponding semiconductor laser elements 22 and reflected by the light-reflective members 24 are collimated through the lens parts 51. As shown in FIGS. 2A and 3A, the identical type of the lens member 29 is employed for both of the first light emitting device 20a and the second light emitting device 20b differing from each other in the number of mounted semiconductor laser elements 22. That is, the type of the lens member 29 employed for the second light emitting device 20b is the same or a similar to the type of the lens member 29 employed for the first light emitting device 20a. Thus, the type of the lens member 29 is unified also with the first light emitting device 20a including the semiconductor laser elements 22 in the arrangement corresponding to any three out of the four semiconductor laser elements 22 in the second light emitting device 20b. The first light emitting device 20a and the second light emitting device 20b can employ the common design of the lens member 29.

The lens member 29 for the first light emitting device 20a can have the number and disposition of the lens parts 51 adjusted so as to correspond to the number and disposition of the semiconductor laser elements 22 mounted on the package 21. Adjusting the number of the lens parts 51 to the number of the semiconductor laser elements 22 can reduce the weight of the lens member 29 as compared to the lens member 29 including the lens parts 51 by the number of the semiconductor laser elements 22 of the second light emitting device 20b.

The lens member 29 can be formed of, for example, glass such as BK7 or B270.

In the light emitting module 100 shown in FIG. 1A, two first mounting substrates 10a are next to each other to form the mounting substrate 10. On each of the two first mounting substrates 10a, two light emitting devices 20 are mounted. Thus, the light emitting module 100 in which four light emitting devices 20 are arranged in a 2-row and 2-column matrix is implemented. In the light emitting module 100 shown in FIG. 1A, two light emitting devices 20 arranged in a 1-row and 2-column matrix are mounted on the mounting surface with an orientation different from each other by 180 degrees.

Specifically, in the light emitting module 100, one first light emitting device 20a and one second light emitting device 20b are mounted next to each other on each of the first mounting substrates 10a, with their respective light-reflective members 24 being next to each other. That is, with respect to two light emitting devices 20 mounted on one first mounting substrate 10a, the following condition is satisfied: a distance from the light-reflective members 24 in one light emitting device 20 to the light-reflective members 24 in other light emitting device 20 is shorter than a distance from the light-reflective members 24 in one light emitting device 20 to the semiconductor laser elements 22 in other light emitting device 20. The same holds true when the one light emitting device 20 and other light emitting device 20 are replaced by each other.

In the light emitting module 100, the first light emitting devices 20a and the second light emitting devices 20b are mounted such that the first light emitting devices 20a are diagonal to each other and the second light emitting devices 20b are diagonal to each other. In this manner, four light emitting devices are mounted in a matrix next to each other on the mounting substrate 10, and the light emitting devices 20 are mounted so that the light-reflective members 24 are next to each other in the row direction.

Two light emitting devices 20 on one first mounting substrate 10a are disposed in this manner, thereby bringing light beams respectively emitted from the two light emitting devices 20 closer to each other. The distance between respective semiconductor laser elements 22 in the two light emitting devices 20 becomes greater and, therefore, heat dissipation can improve. Disposing two first mounting substrates 10a in this manner can gather light beams around the center in the mounting substrate 10.

In the optical unit disclosed in Japanese Patent Publication No. 2007-227422 in which a plurality of semiconductor devices each include four semiconductor elements emit, light emitted from the semiconductor elements directly transmits and exits from the semiconductor devices. Thus, unlikely to the light emitting module 100, it is not necessary to consider how two light emitting devices are preferably disposed in relation to the arrangement of the semiconductor laser elements and the light-reflective members mounted in the package.

On the other hand, in the light emitting devices 20 of the light emitting module 100, the plurality of semiconductor laser elements 22 and the light-reflective members 24 are mounted in each package. Thus, the two light emitting devices are mounted on the mounting substrate 10 with suitable configuration, thereby realizing the light emitting module 100 capable of exhibiting the aforementioned effects.

The light emitting module 100 can be manufactured by using two first light emitting devices 20a in which three semiconductor laser elements 22 are disposed in the identical arrangement and two second light emitting devices 20b. In such a case, by disposing the first light emitting devices 20a diagonally to each other, the semiconductor laser elements 22 in the two first light emitting devices 20a are symmetrically disposed with reference to the center of the mounting substrate 10.

Although it has been described that the light emitting devices 20 are mounted such that their respective light-reflective members 24 are next to each other in the row direction on FIG. 1B, the light emitting devices 20 can be mounted such that their respective light-reflective members 24 are next to each other in the column direction. The light emitting devices 20 can be disposed such that the first light emitting devices 20a are next to each other and the second light emitting devices 20b are adjacent to each other in the row direction. Alternatively, the light emitting devices 20 can be disposed such that the first light emitting devices 20a are next to each other and the second light emitting devices 20b are next to each other in the column direction.

Method of Manufacturing Light Emitting Module

Figure 4:
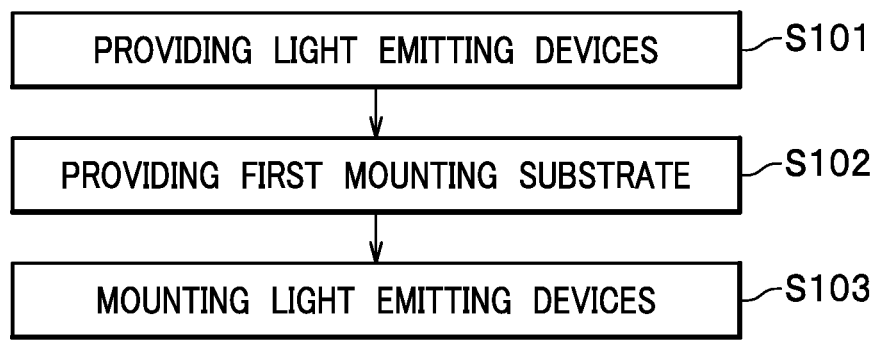
FIG. 4 is a flowchart showing the procedure of a method of manufacturing the light emitting module according to the first embodiment.

Next, a description will be given of an exemplary method of manufacturing the light emitting module 100 according to the first embodiment. FIG. 4 is a flowchart describing the procedure of the manufacturing method of the light emitting module according to the first embodiment.

The manufacturing method of the light emitting module according to the first embodiment is a manufacturing method of the light emitting module 100 including one or more light emitting devices, each including a plurality of light emitting elements. The manufacturing method of the light emitting module 100 includes a step S101 of providing the light emitting devices, a step S102 of providing the first mounting substrates, and a step S103 of mounting the light emitting devices, which steps are performed in this sequence. The manufacturing method of the present disclosure can provide the light emitting module 100 including the light emitting elements 22 by any number selected from at least three continuous numbers. The light emitting modules manufactured by the method of the present disclosure can include a first light emitting module and a second light emitting module in which a total number of the light emitting elements is greater by one than a total number of the light emitting elements in the first light emitting module.

In the following, a description will be given of the steps in the method of manufacturing the light emitting module 100. The material and disposition of each of the members are those described above in relation to the light emitting module 100 and, therefore, such description will be omitted as appropriate.

Step of Providing Light Emitting Devices

The step S101 of providing the light emitting devices is the step of providing, as the light emitting devices to be mounted in the light emitting module 100, a first light emitting device and a second light emitting device differing from each other by one in the number of mounted semiconductor laser elements.

In the step S101, a plurality of first light emitting device 20a each including three semiconductor laser elements 22 and a plurality of second light emitting devices 20b each including four semiconductor laser elements 22 are provided.

Step of Providing First Mounting Substrate

The step S102 of providing the first mounting substrate is the step of providing the first mounting substrate having the mounting surface on which a plurality of connection patterns each corresponds to one light emitting device. The connection patterns 15 have the identical pattern to each other.

The step S102 provides at least one first mounting substrate 10a having the mounting surface provided with two connection patterns 15 each corresponding to one light emitting device 20 and enable any of the first light emitting device 20a and the second light emitting device 20b to be mounted thereon.

Step of Mounting Light Emitting Devices

The step S103 of mounting the light emitting devices is the step of mounting the light emitting devices on a plurality of connection patterns provided at the mounting surface of the first mounting substrate. The light emitting devices are selected from the first light emitting devices and the second light emitting devices.

In the step S103, two light emitting devices are respectively mounted on two connection patterns 15 provided at the mounting surface of the first mounting substrate 10a. The two light emitting devices are desirably selected from the first light emitting devices 20a and the second light emitting devices 20b.

Examples of the light emitting module 100 on which the selected two light emitting devices 20 are mounted include the light emitting module 100 on which two first light emitting devices 20a are mounted, the light emitting module 100 on which one first light emitting device 20a and one second light emitting device 20b are mounted, and the light emitting module 100 on which two second light emitting devices 20b are mounted. These three light emitting modules 100 are sequentially greater in the number of mounted light emitting elements by one.

Accordingly, different combinations of two light emitting devices 20 are mounted on respective three light emitting modules 100. This can result in producing the light emitting module 100 including the light emitting elements 22 by any number selected from three continuous numbers.

The light emitting module 100 in which at least one light emitting device includes a plurality of light emitting elements, and which is manufactured according to the manufacturing method according to the first embodiment is not limited to these three light emitting modules 100. The present disclosure can provide: a light emitting module 100 in which one light emitting device 20 is mounted on one first mounting substrate 10a as a whole; a light emitting module 100 in which three light emitting devices 20 are mounted on two first mounting substrates 10a as a whole; and a light emitting module 100 in which four light emitting devices 20 are mounted on two first mounting substrates 10a as a whole.

In the step S103 in manufacturing the light emitting module 100 shown in FIG. 1A, two light emitting devices 20 in a 1-row and 2-column matrix (i.e., the first light emitting device 20a and the second light emitting device 20b) are mounted on the mounting surface with an orientation different from each other by 180 degrees. Furthermore, in this step S103, two first mounting substrates 10a each of which include two light emitting devices 20 (i.e., the first light emitting device 20a and the second light emitting device 20b) are arranged next to each other. This can produce the light emitting module 100 in which four light emitting devices 20 are arranged in a 2-row and 2-column matrix. Thus, in the light emitting module 100, the four light emitting devices 20 are disposed at the center. On the outer edge relative to the four light emitting devices 20, through holes for screw fixing are provided on one opposite sides so as to sandwich the four light emitting devices 20 therebetween, while the second metal films 13 are formed on other opposite sides. The second metal films 13 being provided on the opposite sides can establish connection to the power supply more easily as compared to the second metal films 13 being interposed between two light emitting devices 20.

In this manner, using the first mounting substrates 10a, the first light emitting devices 20a, and the second light emitting devices 20b, the light emitting module 100 equipped with one to four light emitting device(s) is manufactured. Such light emitting module 100 is capable of efficiently meeting various product specifications having the number of the mounted semiconductor laser elements 22 adjusted to any number from 3 to 16 (excluding 5).

In the case in which the number of the semiconductor laser elements 22 mounted on the first light emitting device 20a is 2 and the number of the semiconductor laser elements 22 mounted on the second light emitting device 20b is 3, the light emitting module 100 in which the number of the mounted semiconductor laser elements can be adjusted to any number from 2 to 12 can be provided. When the number of the semiconductor laser elements 22 mounted on the first light emitting device 20a is 4 and the number of the semiconductor laser elements 22 mounted on the second light emitting device 20b is 5, the light emitting module 100 in which the number of the mounted semiconductor laser elements can be adjusted to any number from 4 to 20 (excluding 6, 7, and 11) is provided.

Second Embodiment

Next, a description will be given of a second embodiment.

Figure 5A:
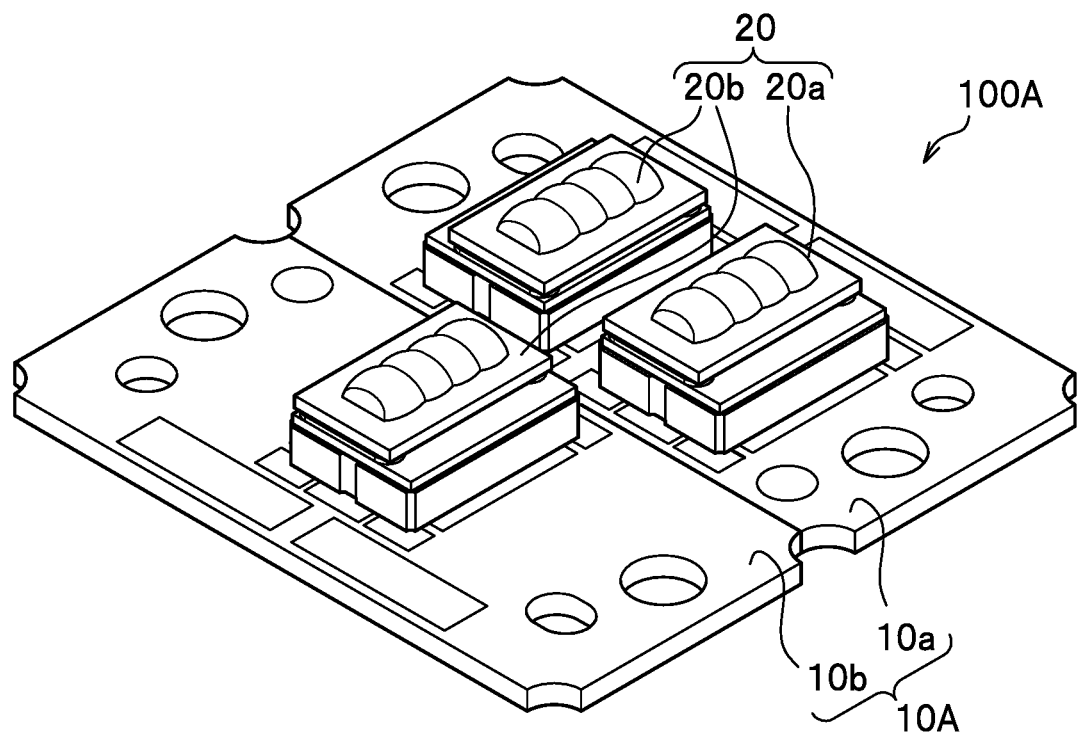
FIG. 5A is a perspective view schematically showing an exemplary configuration of a light emitting module according to a second embodiment.
Figure 5B:
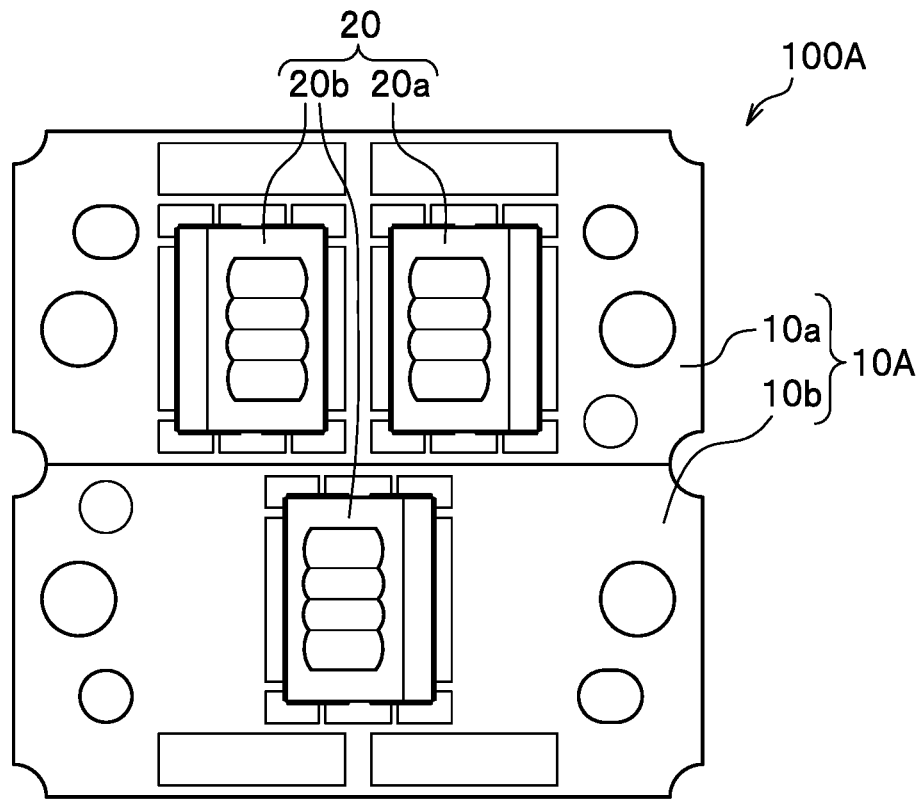
FIG. 5B is a top view schematically showing an exemplary configuration of the light emitting module according to the second embodiment.
Figure 5C:
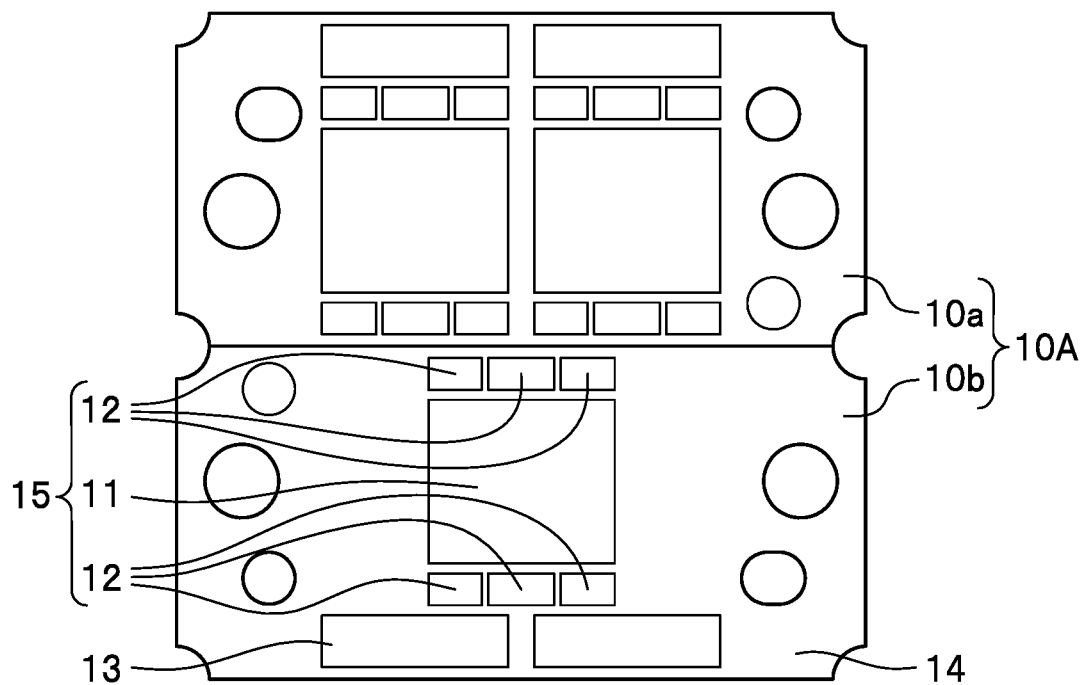
FIG. 5C is a top view schematically showing an exemplary configuration of a mounting substrate according to the second embodiment.
Figure 5D:
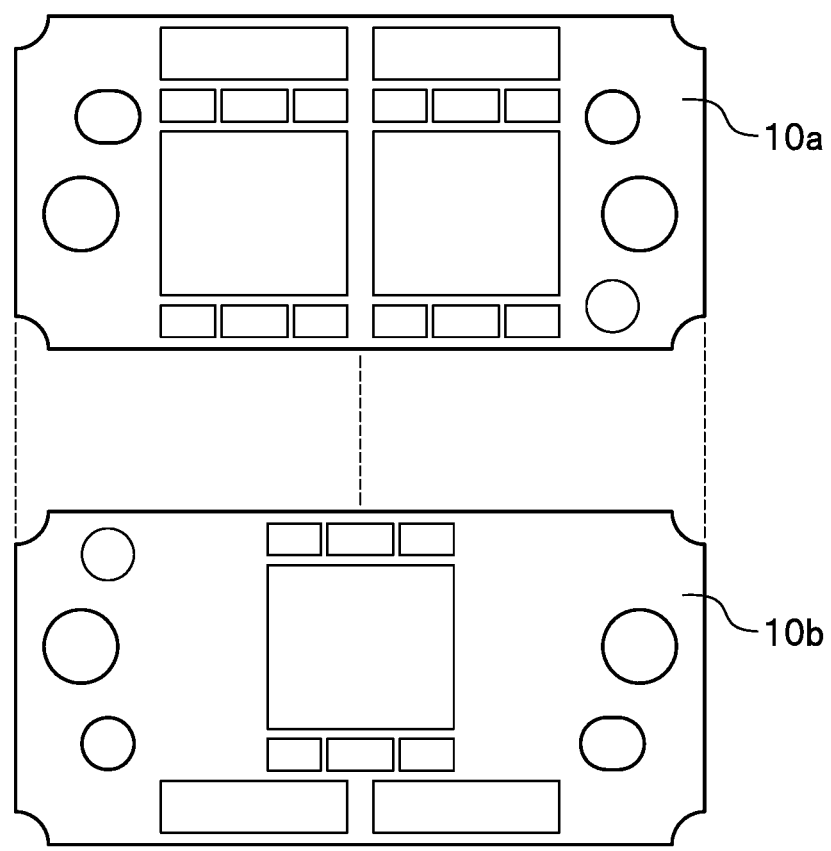
FIG. 5D is a top view in which the mounting substrate in FIG. 5C is split into a first mounting substrate and a second mounting substrate.

FIG. 5A is a perspective view schematically showing an exemplary configuration of a light emitting module according to the second embodiment. FIG. 5B is a top view schematically showing an exemplary configuration of the light emitting module according to the second embodiment. FIG. 5C is a top view schematically showing an exemplary configuration of a mounting substrate according to the second embodiment. FIG. 5D is a top view in which the mounting substrate in FIG. 5C is separated into a first mounting substrate and a second mounting substrate. The light emitting module according to the second embodiment include a second mounting substrate in addition to the first mounting substrate. This is the difference from the light emitting module according to the first embodiment.

Light Emitting Module

A light emitting module 100A shown in FIG. 5A includes a mounting substrate 10A and light emitting devices 20. On the light emitting module 100A, three light emitting devices 20 are mounted.

The mounting substrate 10A of the light emitting module 100A is formed of the first mounting substrate 10a and the second mounting substrate 10b.

The second mounting substrate 10b is identical in outer shape as the first mounting substrate 10a. The second mounting substrate 10b includes a lower surface, an upper surface, and lateral surfaces. The upper surface includes a mounting surface on which the connection pattern 15 having the same pattern as the connection pattern 15 provided at the first mounting substrate 10a. The second mounting substrate 10b can have the identical outer shape to the first mounting substrate 10a despite including only one connection pattern 15. This can produce the light emitting module 100A having the identical outer shape as in the case of the light emitting module employing two pieces of the first mounting substrate 10a.

In the present embodiment, the connection pattern 15 of the second mounting substrate 10b is provided substantially at the center. In the upper surface, the region where the connection pattern 15 of the second mounting substrate 10b is provided partially overlaps to the regions where two connection patterns 15 of the first mounting substrate 10a are provided. The second metal films 13 and the through holes of the second mounting substrate 10b are at the same positions as those of the first mounting substrate 10a. By disposing the second metal films 13 at the identical position of those mounting substrates, the first mounting substrate 10a and the second mounting substrate 10b can be electrically connected to the external power supply by a similar manner. For example, the power supply can be connected to the second metal films 13 via a connector, a flexible substrate, a glass epoxy substrate, a leaf spring terminal or the like. In the case of using such a connecting member, electrical connection between the first mounting substrate 10a and the second mounting substrate 10b by using the identical connecting member. By disposing the through holes at the identical positions of those mounting substrate, screw fixing can be performed for the second mounting substrate 10b at the same positions as in the case of using the two first mounting substrates 10a. Among three pairs of first metal films 12 sandwiching the metal part 11 therebetween in the second mounting substrate 10b, three first metal films 12 (i.e., one-counterpart first metal films 12) closer to the second metal films 13 are continuous to one of the two second metal films 13 and electrically connected. Three first metal films 12 (i.e., other-counterpart first metal films 12) far from the second metal film 13 are continuous to other second metal film 13 and electrically connected.

On the second mounting substrate 10b, one light emitting device 20 is mounted. In FIG. 5A, one second light emitting device 20b is mounted on the second mounting substrate 10b. The first mounting substrate 10a and the second mounting substrate 10b are next to each other such that their respective lateral surfaces opposite to the sides, along which the second metal films 13 are formed, face each other. The rest of the configuration is the same as or a similar to that of the light emitting module 100 according to the first embodiment shown in FIG. 1A.

Method of Manufacturing Light Emitting Module

Next, a description will be given of an exemplary method of manufacturing the light emitting module 100A according to the second embodiment.

Figure 6:
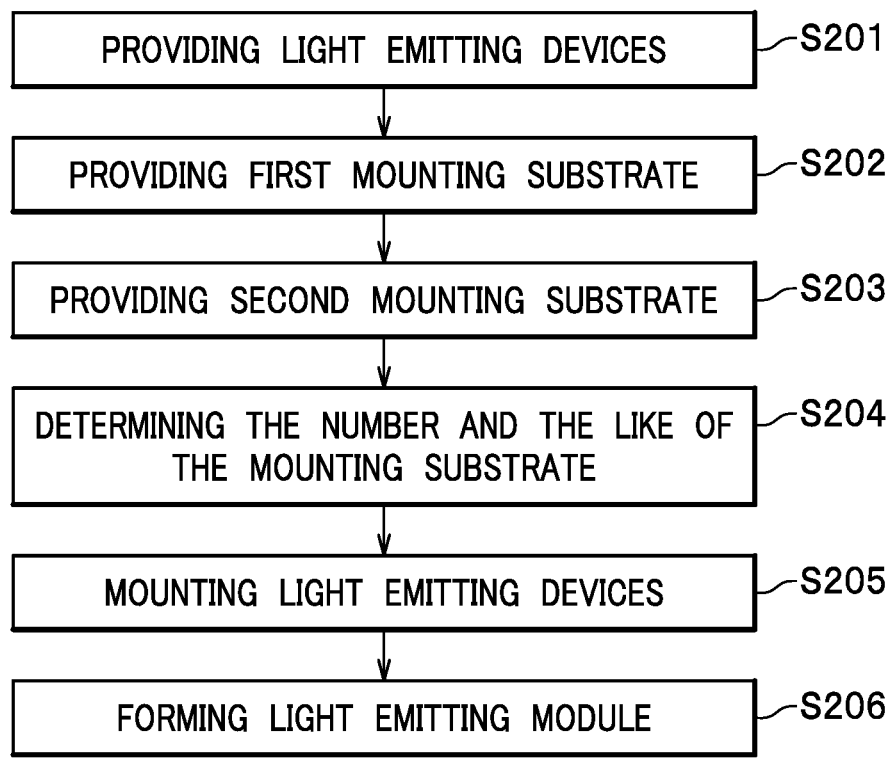
FIG. 6 is a flowchart showing the procedure of a method of manufacturing the light emitting module according to the second embodiment.

FIG. 6 is a flowchart describing the procedure of the manufacturing method of the light emitting module according to the second embodiment.

The method of manufacturing the light emitting module 100A includes a step S201 of providing the light emitting devices, a step S202 of providing the first mounting substrate, a step S203 of providing the second mounting substrate, a step S204 of determining the number and the like of the mounting substrates, a step S205 of mounting the light emitting devices, and a step S206 of forming the light emitting module, which steps are performed in this sequence. The material and disposition of each of the members are those described above in relation to the light emitting module 100 and, therefore, such description will be omitted as appropriate. The step S201 of providing the light emitting devices and the step S202 of providing the first mounting substrate are the same or a similar to the step S101 of providing the light emitting devices and the step S102 of providing the first mounting substrates in the method of manufacturing the light emitting module 100 according to the first embodiment and, therefore, the description thereof is omitted herein.

Step of Providing Second Mounting Substrate

The step S203 of providing the second mounting substrate is the step of providing the second mounting substrate having the mounting surface provided with one connection pattern identical to that of the first mounting substrate.

The step S203 include providing the second mounting substrate 10b having the mounting surface on which one connection pattern 15 identical to the connection pattern 15 of the first mounting substrate 10a is provided.

Step of Determining the Number and the Like of the Mounting Substrate

The step S204 of determining the number and the like of the mounting substrate is the step of determining the number or the number and combination of the mounting substrate selected from a plurality of mounting substrates including at least the first mounting substrate and the second mounting substrate used in manufacturing the light emitting module.

The step S204 includes determination whether one mounting substrate is used or two mounting substrates are used to configure the mounting substrate 10A of the light emitting module 100A. In the case of using one mounting substrate, whether the first mounting substrate 10a or the second mounting substrate 10b is used is determined. In the case of using two mounting substrates are whether a combination of two first mounting substrates 10a or a combination of one first mounting substrate 10a and one second mounting substrate 10b is used is determined. The mounting substrate 10A can be formed of a combination of two second mounting substrates 10b to mount two light emitting devices 20. However, mounting the two light emitting devices 20 can be realized by using one first mounting substrate 10a, to thereby provide a smaller light emitting module 100A.

In manufacturing the light emitting module 100A shown in FIG. 5A, it is determined to use a combination of one first mounting substrate 10a and one second mounting substrate 10b as the two mounting substrates, to configure the mounting substrate 10A.

Step of Mounting Light Emitting Devices

The step S205 of mounting the light emitting devices is the step of mounting one light emitting device selected from the first light emitting device and the second light emitting device on the connection pattern of the second mounting substrate in the case in which the second mounting substrate is used in the light emitting module. Also, this step S205 is the step of mounting a plurality of light emitting devices selected out of the first light emitting device and the second light emitting device on a plurality of connection patterns formed at the mounting surface of the first mounting substrate assuming the first mounting substrate is to be used in the light emitting module.

In manufacturing the light emitting module 100A shown in FIG. 5A, one second light emitting device 20b is mounted on the second mounting substrate 10b. Furthermore, one first light emitting device 20a and one second light emitting device 20b are mounted on the first mounting substrate 10a as being next to each other, so that two light emitting devices 20 in a 1-row and 2-column matrix are mounted on the mounting surface with an orientation different from each other by 180 degrees.

Step of Forming Light Emitting Module

The step S206 of forming the light emitting module is the step of forming the light emitting module using at least one of the first mounting substrate and the second mounting substrate equipped with the light emitting devices by the determined number or the determined number and combination.

In manufacturing the light emitting module 100A shown in FIG. 5A, the light emitting module 100A includes one first mounting substrate 10a and one second mounting substrate 20a. The first mounting substrate 10a includes the one first light emitting device 20a and one second light emitting device 20b, and the second mounting substrate 10b includes one second light emitting device 20b. Use of the second mounting substrate 10b in mounting one light emitting device 20 can eliminate a vacant connection pattern 15 which would occur with the first mounting substrate 10a. Furthermore, with the first mounting substrate 10a, in order to establish electrical connection to the external power supply, electrical connection must be established between the second metal films 13 of the connection pattern 15 to which the light emitting device 20 is connected and the first metal films 12 of the connection pattern 15 where no light emitting device 20 is connected. However, the second mounting substrate 10b can establish electrical connection by using the two second metal films 13. In the present embodiment, the first mounting substrate 10a is used to mount two light emitting devices 20 on one mounting substrate, and the second mounting substrate 10b is used to mount one light emitting device 20. In either way, electrical connection to the external power supply can easily be established through two second metal films 13.

As has been described in relation to the method of manufacturing the light emitting module 100 according to the first embodiment, it is obvious that using the light emitting module 100A manufactured according to the method according to the second embodiment can similarly provide a light emitting module equipped with the light emitting device(s) 20 by the arbitrary number from 1 to 4.

Third Embodiment

Next, a description will be given of a third embodiment.

Figure 7A:
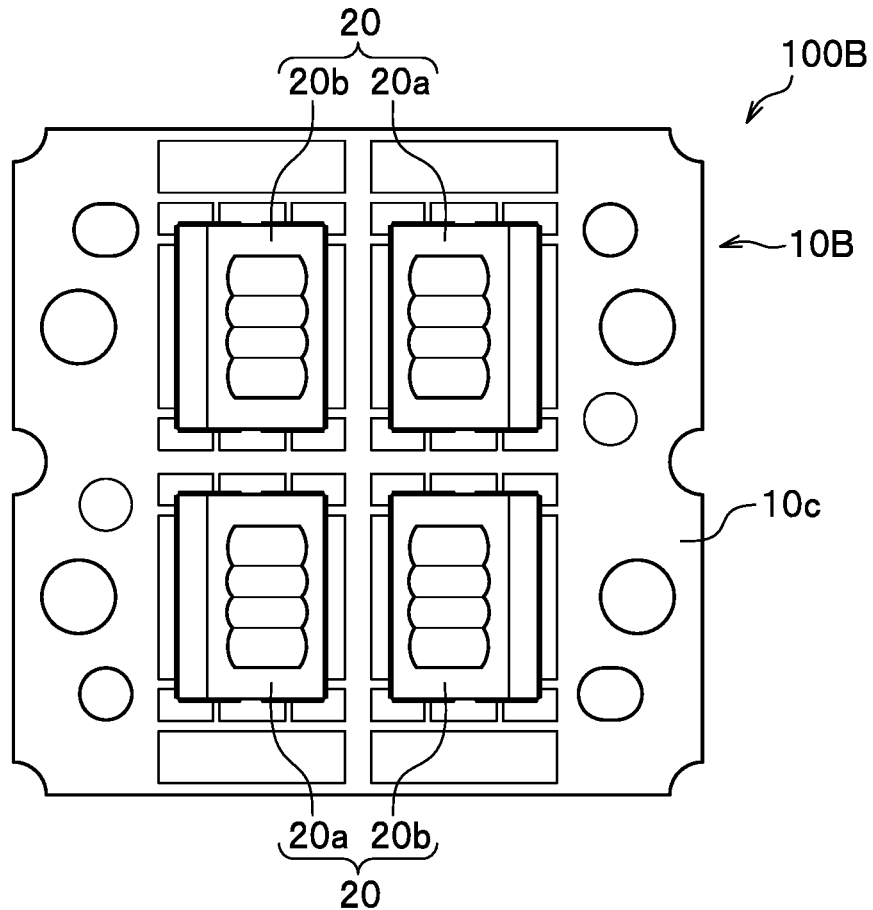
FIG. 7A is a top view schematically showing an exemplary configuration of a light emitting module according to a third embodiment.
Figure 7B:
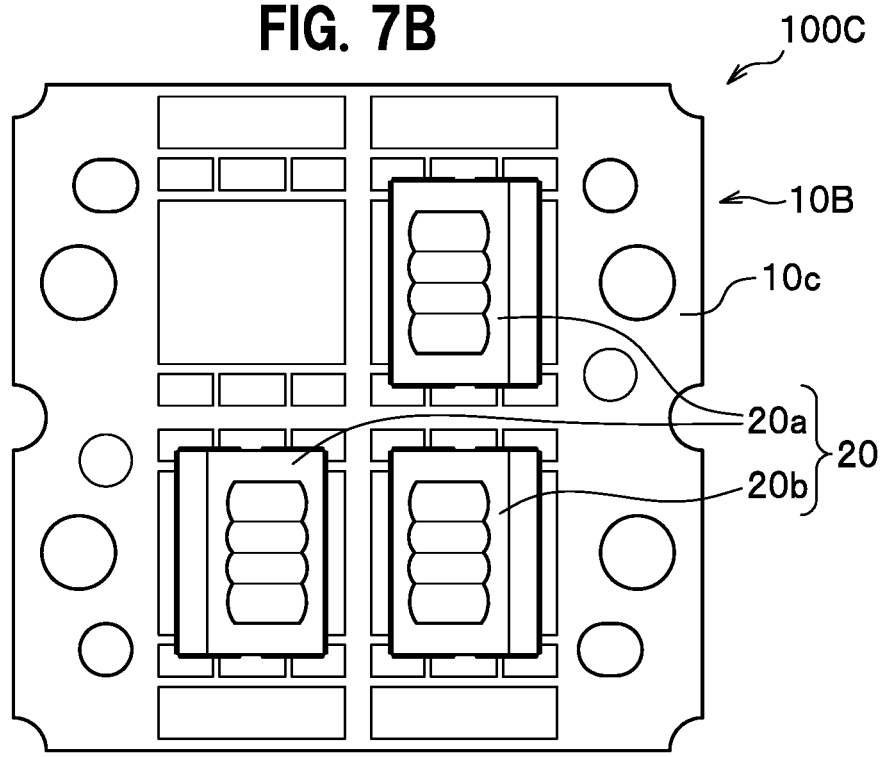
FIG. 7B is a top view schematically showing an exemplary configuration of the light emitting module according to the third embodiment.
Figure 7C:
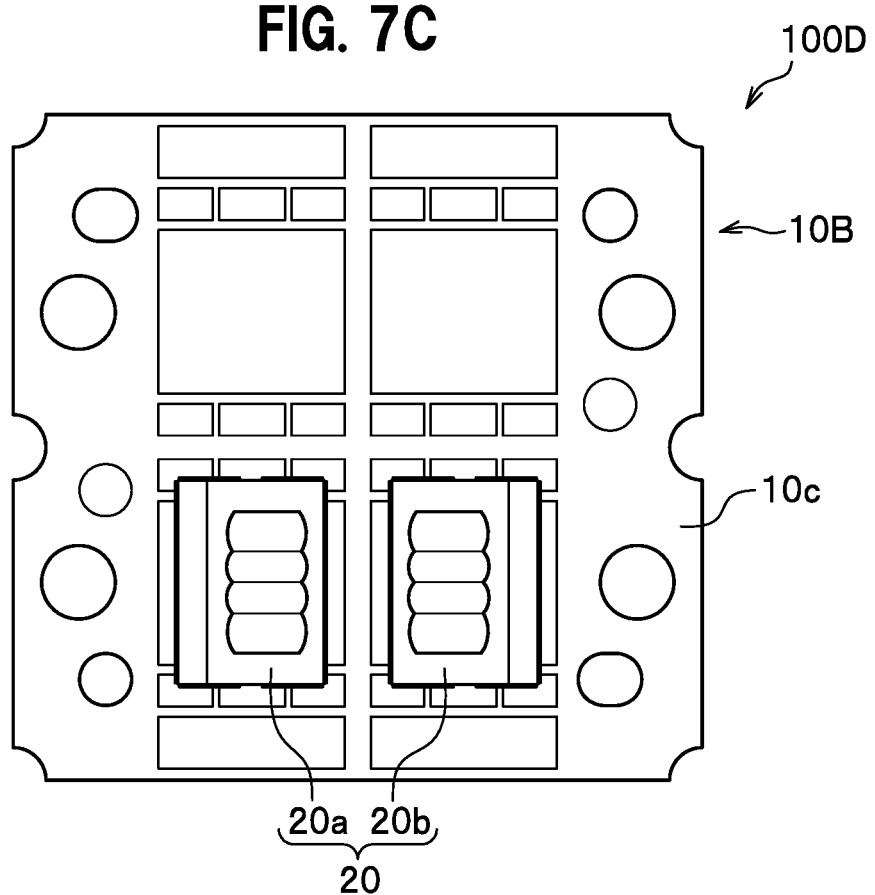
FIG. 7C is a top view schematically showing an exemplary configuration of the light emitting module according to the third embodiment.

FIG. 7A is a top view schematically showing an exemplary configuration of a light emitting module according to a third embodiment. FIG. 7B is a top view schematically showing an exemplary configuration of the light emitting module according to the third embodiment. FIG. 7C is a top view schematically showing an exemplary configuration of the light emitting module according to the third embodiment.

In the light emitting module 100B according to the third embodiment shown in FIG. 7A, a mounting substrate 10B of a light emitting module 100B configures as one first mounting substrate 10c having the mounting surface on which four connection patterns 15 each having the same pattern are arranged in a 2-row and 2-column matrix. On the four connection patterns 15 in the light emitting module 100B, the light emitting device(s) 20 is/are mounted by the arbitrary number from 1 to 4. FIGS. 7A to 7C respectively show the light emitting module 100B equipped with four light emitting devices 20, a light emitting module 100C equipped with three light emitting devices 20, and a light emitting module 100D equipped with two light emitting devices 20. The present disclosure allows four light emitting devices 20 to be mounted on one mounting substrate, thereby achieving simplified manufacturing processes.

Figure 8:
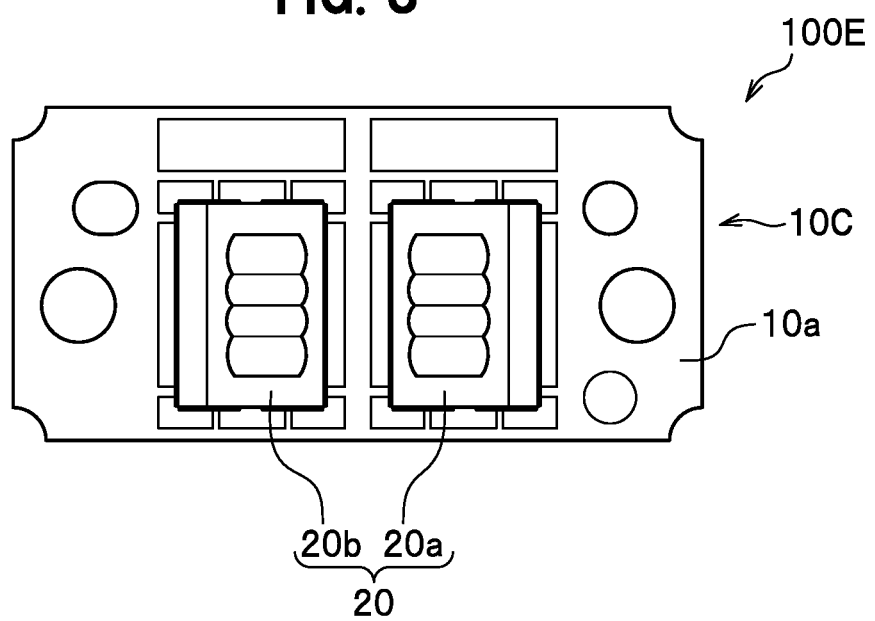
FIG. 8 is a plan view schematically showing an exemplary configuration of a light emitting module according to certain embodiment.

The description has been given of the exemplary configurations and manufacturing methods of the light emitting modules of the present disclosure through the first, second, and third embodiments. In the description, what is disclosed is a light emitting module including: a first light emitting device on which a plurality of light emitting elements is mounted; a second light emitting device on which light emitting elements are mounted greater by one in number than those mounted on the first light emitting device; and a first mounting substrate having a mounting surface provided with a plurality of connection patterns each of which has the same pattern and corresponds to the light emitting devices. In the light emitting module, at least one first light emitting device and at least one second light emitting device are connected to on the plurality of connection patterns provided at the mounting surface of the first mounting substrate. A light emitting module 100E shown in FIG. 8 is a specific suitable example of the light emitting module in which the number of mounted light emitting elements is adjusted. This can produce the light emitting module efficiently meeting various product specifications in relation to light output.

Fourth Embodiment

Next, a description will be given of a fourth embodiment.

Figure 9A:
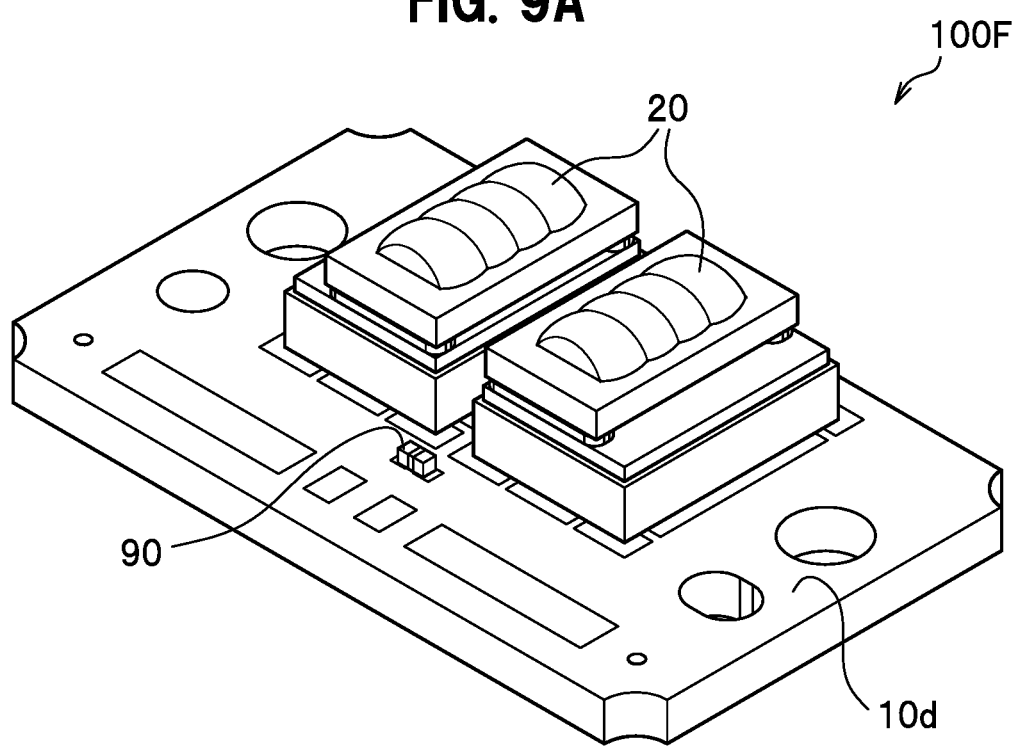
FIG. 9A is a perspective view schematically showing an exemplary configuration of a light emitting module according to a fourth embodiment.
Figure 9B:
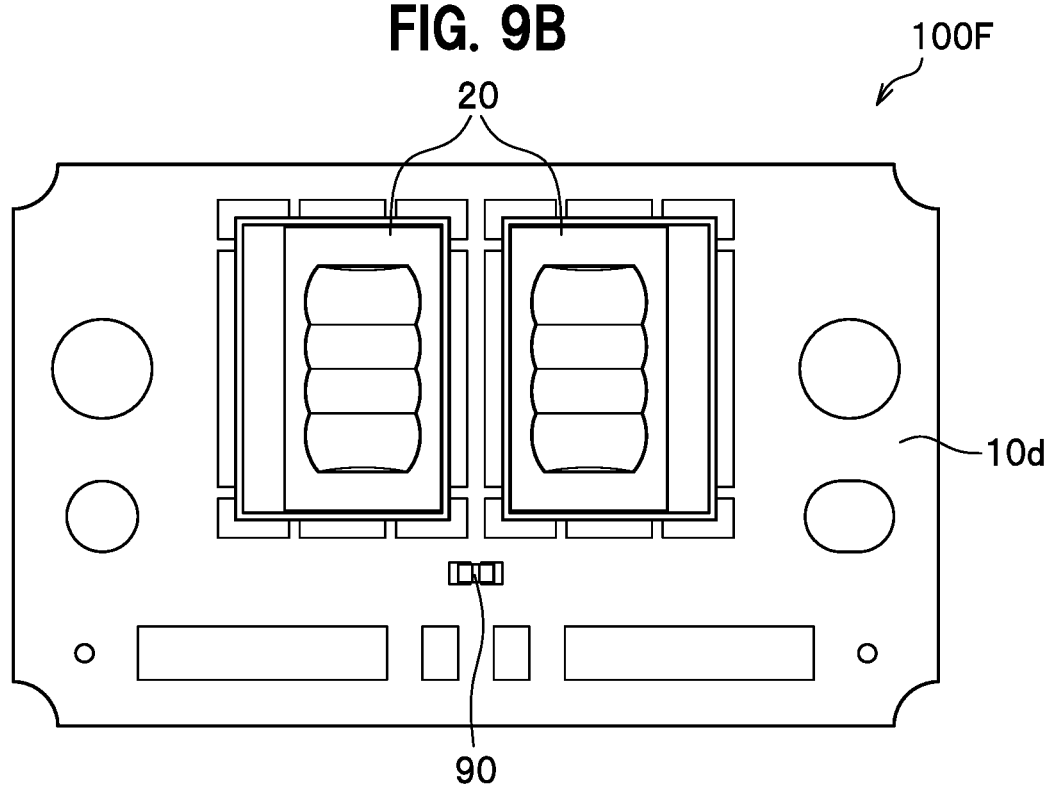
FIG. 9B is a top view schematically showing an exemplary configuration of the light emitting module according to the fourth embodiment.
Figure 9C:
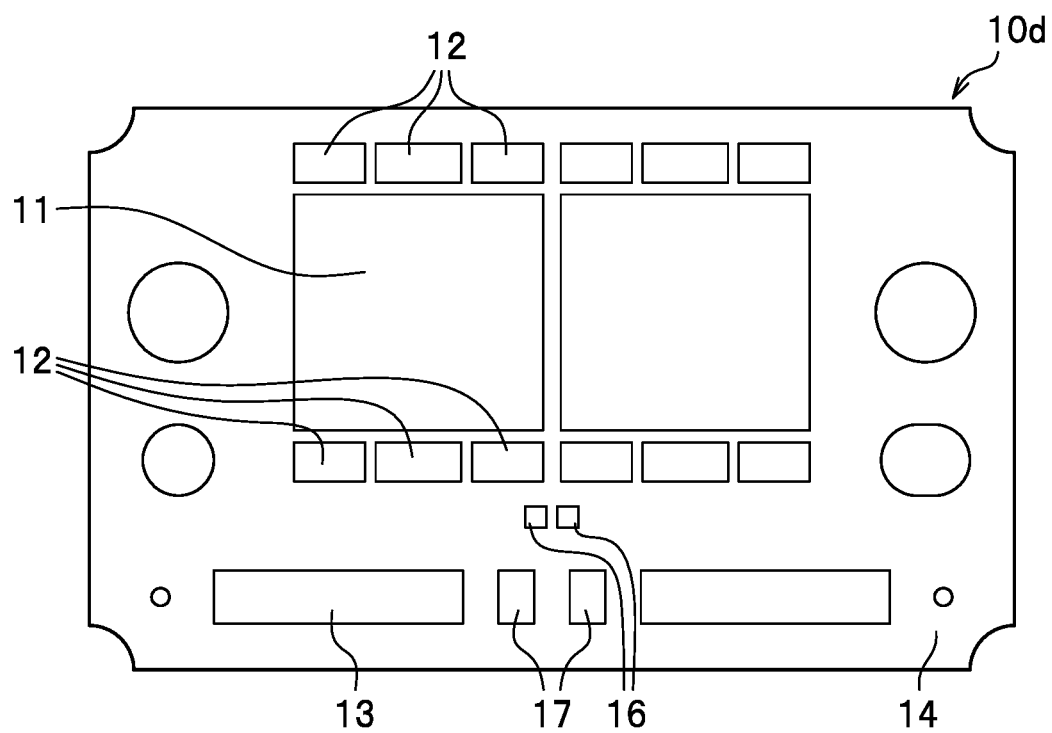
FIG. 9C is a top view schematically showing a first mounting substrate according to the fourth embodiment.
Figure 9D:
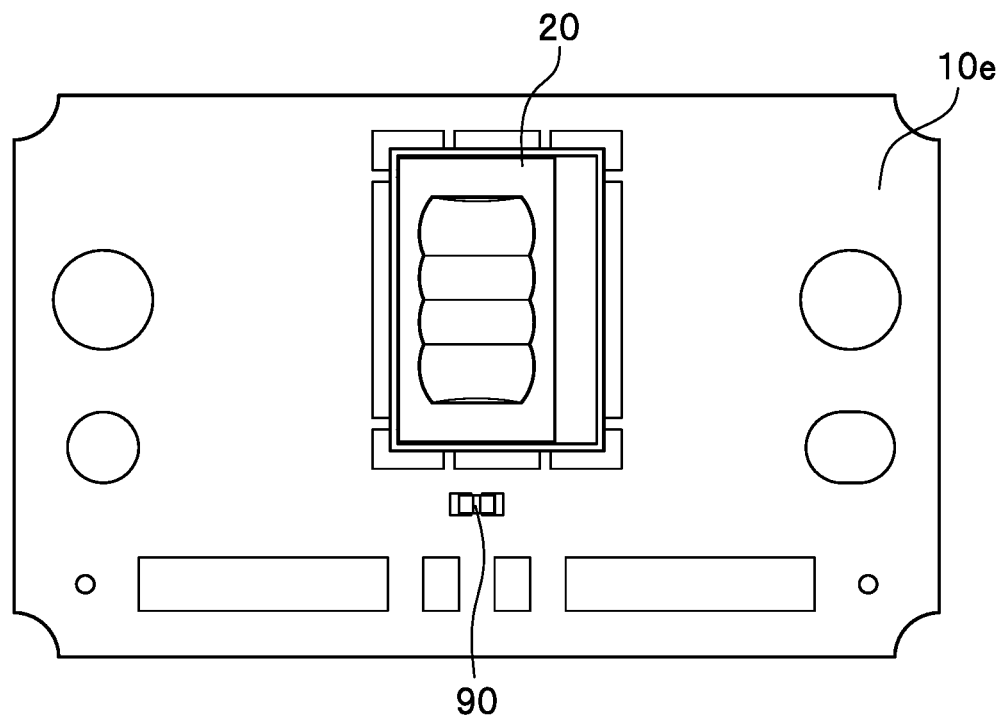
FIG. 9D is a top view schematically showing a light emitting device and a thermistor mounted on a second mounting substrate according to the fourth embodiment.
Figure 9E:
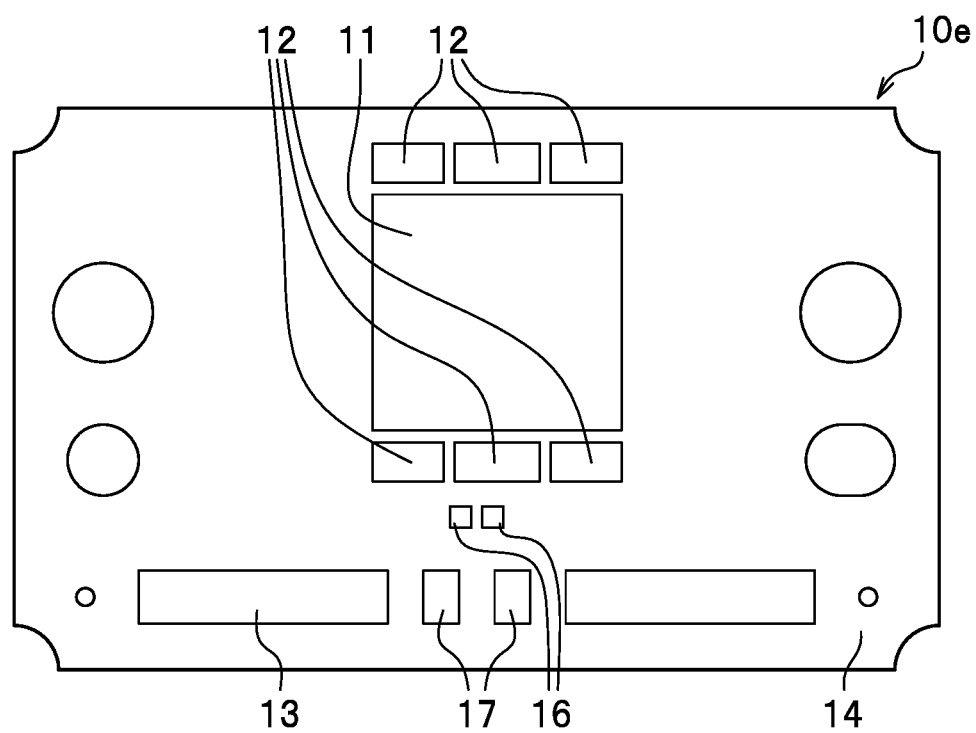
FIG. 9E is a top view schematically showing the second mounting substrate according to the fourth embodiment.

FIG. 9A is a perspective view schematically showing a light emitting module according to a fourth embodiment. FIG. 9B is a top view schematically showing the light emitting module according to the fourth embodiment. FIG. 9C is a top view schematically showing a first mounting substrate according to the fourth embodiment. FIG. 9D is a top view schematically showing a light emitting device and a thermistor mounted on a second mounting substrate according to the fourth embodiment. FIG. 9E is a top view schematically showing the second mounting substrate according to the fourth embodiment.

The mounting substrate of the light emitting module according to the fourth embodiment is different from those described in the first to third embodiments in that other metal films for mounting thermistor is provided on the mounting surface of the mounting substrate.

As shown in FIG. 9C, on a first mounting substrate 10d according to the fourth embodiment, the metal parts 11, the first metal films 12, the second metal films 13, third metal films 16, and fourth metal films 17. Each of the connection patterns 15 formed of the metal part 11 and the first metal films 12 has the same pattern as described the aforementioned embodiments.

In the first mounting substrate 10d, the third metal films 16 are provided, and thus the distance between the first metal films 12 and the second metal films 13 is greater than that of the first mounting substrate 10a. Two of the third metal films 16 are provided between the first metal films 12 and the second metal films 13 such that the distance from emitted light of one of two light emitting devices 20 is the same as the distance from emitted light of the other one of the two light emitting devices 20. Accordingly, in the first mounting surface 10d, the distances between the two third metal films 13 and the two connection patterns 15 are the same. In other words, the distance between the one of the connection patterns 15 and one of the third metal films 16 is the same as the distance between the other one of the connection patterns 15 and the other one of the third metal films 16.

The fourth metal films 17 are provided between two of second metal films 13, and thus the distance between two of the second metal films 13 is greater than that of the first mounting substrate 10a. Two of the four metal films 17 are positioned between two of the second metal films 13.

The third metal films 16 and the fourth metal films 17 are provided on the insulating film 14 by forming one metal film in which one of the third metal films 16 and one of the fourth metal films 17 are continued to each other, and forming the insulating film 14 thereon so as to define the third metal films 16 and the fourth metal films 17. That is, it cannot be seen externally, the third metal films 16 and the fourth metal films 17 are continuous to each other and electrically connected to each other. One of the third metal films 16 and one of the fourth metal films 17 are connected, and the other one of the third metal films 16 and the other one of the fourth metal films 17 are connected.

In the light emitting module 100F according to the fourth embodiment shown in FIGS. 9A and 9B, a thermistor 90 is mounted on the third metal films 16. The thermistor 90 is an example component of temperature detection elements for measuring temperature of the light emitting module 100F in operation. The thermistor 90 are connected to both two of the third metal films 16 to be mounted. This enables electrical conduction from one of the fourth metal films 17 to the other one of the fourth metal films 17 through the thermistor 90.

In the light emitting module 100F, semiconductor laser elements 22 in two light emitting devices 20 mounted on the first mounting substrate 10d become heat sources. Therefore, the thermistor 90 is preferably disposed in a position close from any of two light emitting devices 20 while being positioned at the same distance from light emitted from either one of the light emitting devices. That is, in the case in which the light emitting module 100F is designed such that the center of light emitted from the semiconductor laser elements 22 in two of the light emitting devices 20 passes through the apex of the lens parts 51, the thermistor 90 is disposed on an imaginary center line between an imaginary line connecting the apexes of the lens parts 51 of one of the light emitting devices 20 and an imaginary line connecting the apexes of the lens parts 51 of the other one of the light emitting devices 20.

As in the case of the first mounting substrate 10d, in the second mounting substrate 10e according to the fourth embodiment shown in FIGS. 9D and 9D, the third metal films 16 and the fourth metal films 17 are provided, and then the thermistor 90 is mounted on the third metal films 16. The second mounting substrate 10e is the same as the first mounting substrate 10d in that the third metal films 16 are provided between the first metal films 12 and the second metal films 13, and the fourth metal films 17 are provided between the second metal films 13.

However, the thermistor 90 is supposed to be disposed at the position close to light emitted from the light emitting device 20, and thus, as in the second mounting substrate 10e, the thermistor 90 is disposed at the position close to the apexes of the lens parts 51 of the lens members 29 in the light emitting device 20. That is, in the case in which the light emitting module is designed such that the center of light emitted from the semiconductor laser elements 22 mounted in the light emitting device 20 respectively passes through the apexes of the lens parts 51, the thermistor 90 is disposed on an imaginary line connecting the apexes of the lens parts 51 as seen from the top.

The light emitting module 100F according to the fourth embodiment includes the thermistor 90 mounted on the metal films, and such thermistor 90 is used to measure the temperature of the light emitting module 100F in operation. Accordingly, the operation of the semiconductor laser elements 22 can be controlled according to the measured temperature.

The light emitting module manufactured in this manner is applicable to, for example, a projector of any of various specifications. Specifically, a light emitting module including at least one of the first mounting substrate and the second mounting substrate equipped with light emitting devices by the determined number or the determined number and combination is mounted on a heat dissipating plate, to thereby configure a constituent of a projector.

Next, a description will be given of an exemplary application of the light emitting module according to the present embodiment to a projector. Although the following description exemplary employs mounting substrates formed from one or more of the first mounting substrates 10a, it is needless to say that the configuration is not required thereto. The mounting substrates can be formed from the first and second mounting substrates according to the first through fourth embodiments.

Figure 10A:
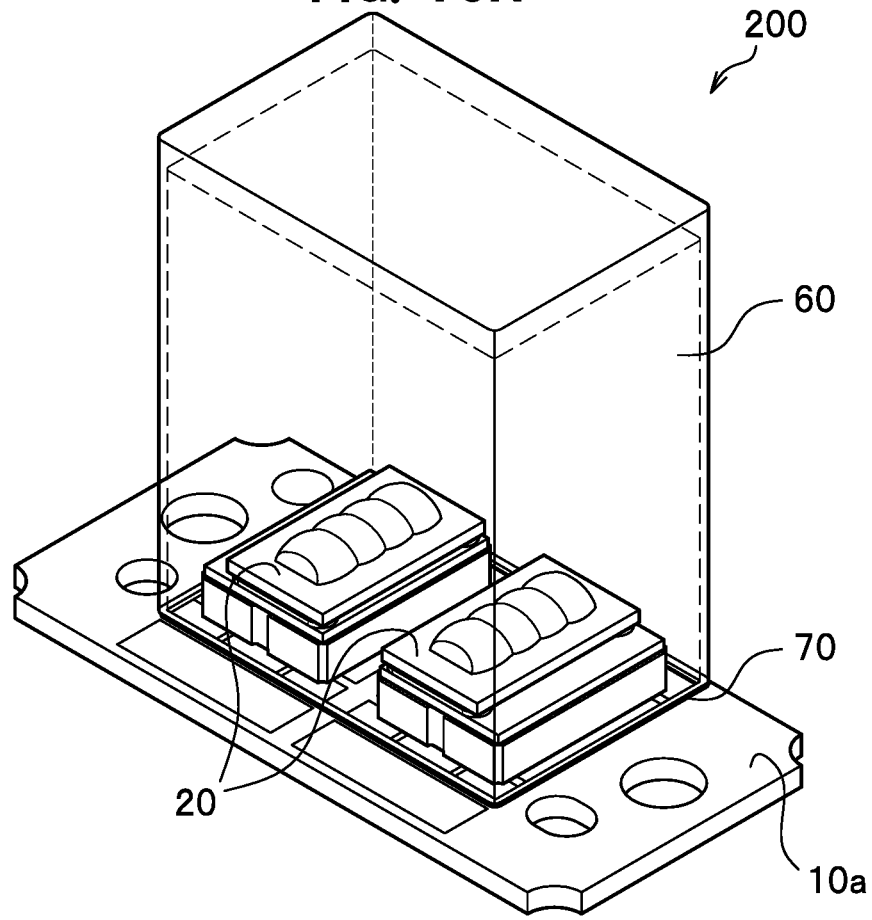
FIG. 10A is a perspective view schematically showing an exemplary application of a light emitting module according to certain embodiment to a projector.
Figure 10B:
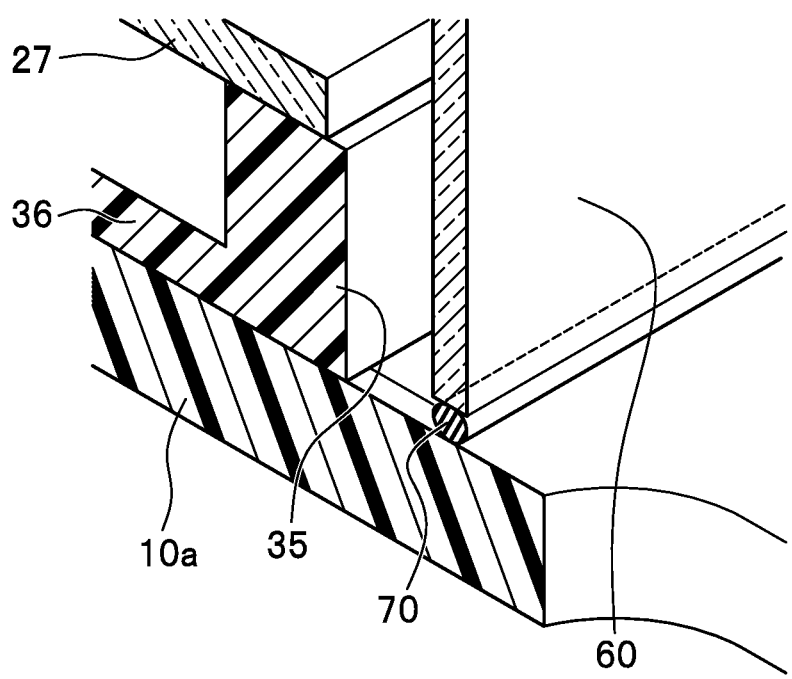
FIG. 10B is a perspective cross-sectional view for illustrating a sealing structure of the light emitting module according to certain embodiment.
Figure 11A:
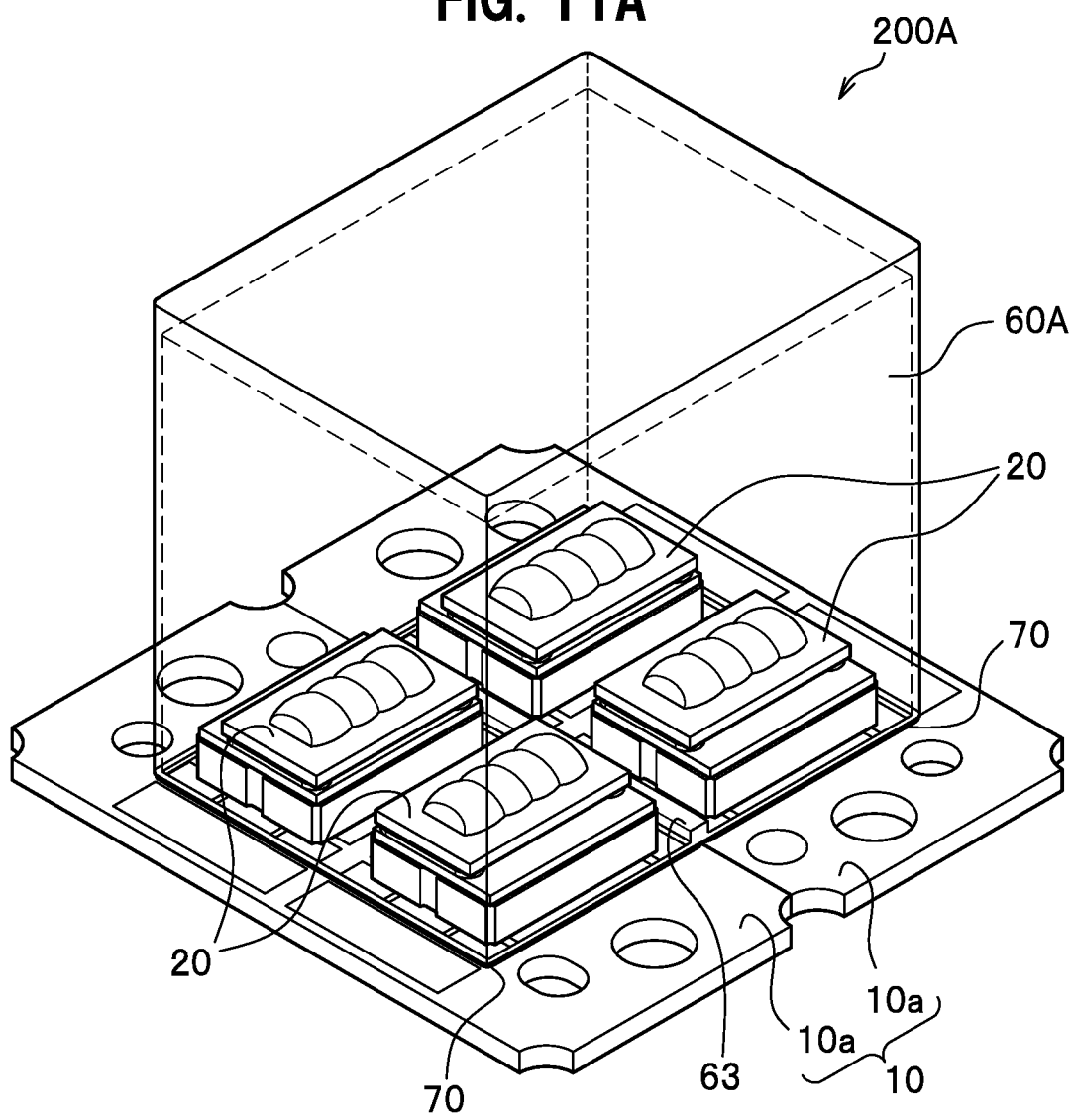
FIG. 11A is a perspective view schematically showing an exemplary application of a light emitting module according to certain embodiment to a projector.
Figure 11B:
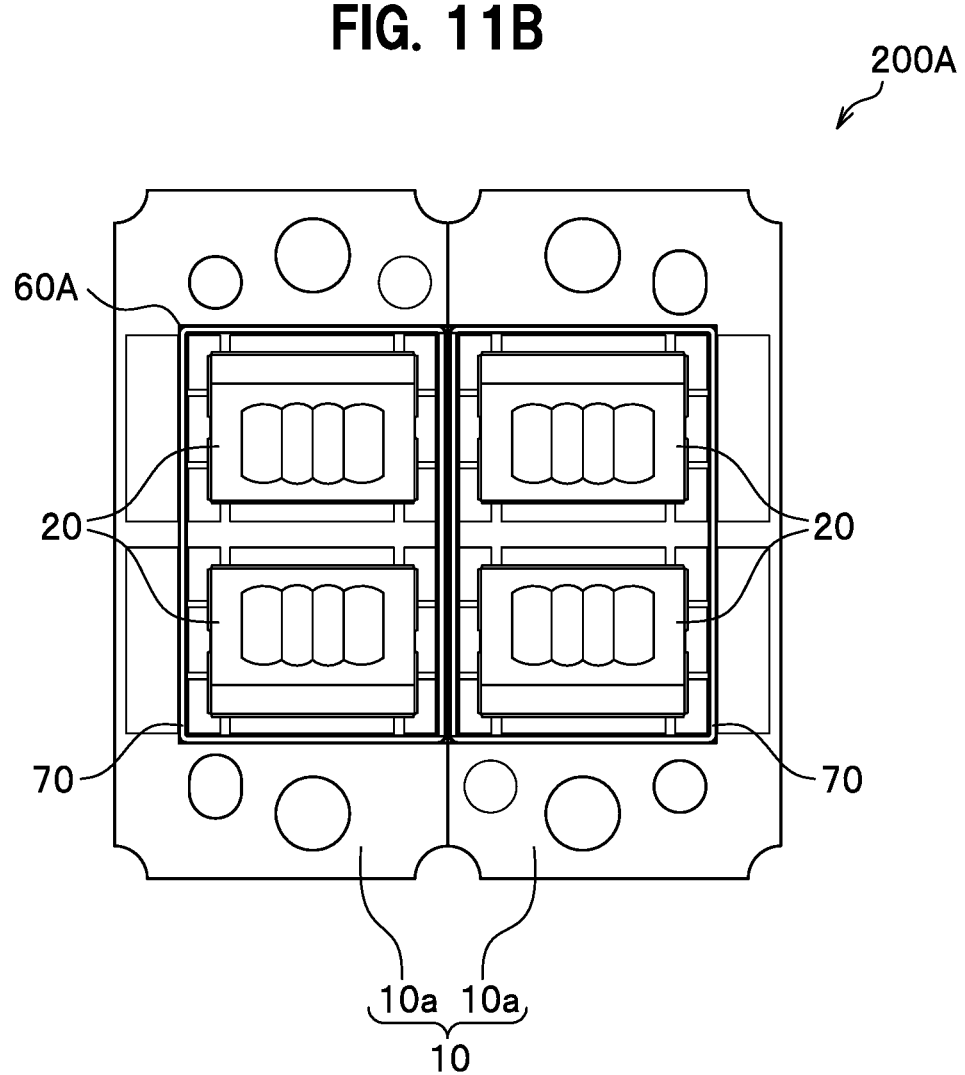
FIG. 11B is a top view schematically showing an exemplary configuration of the projector according to the embodiment shown in FIG. 11A.
Figure 12B:
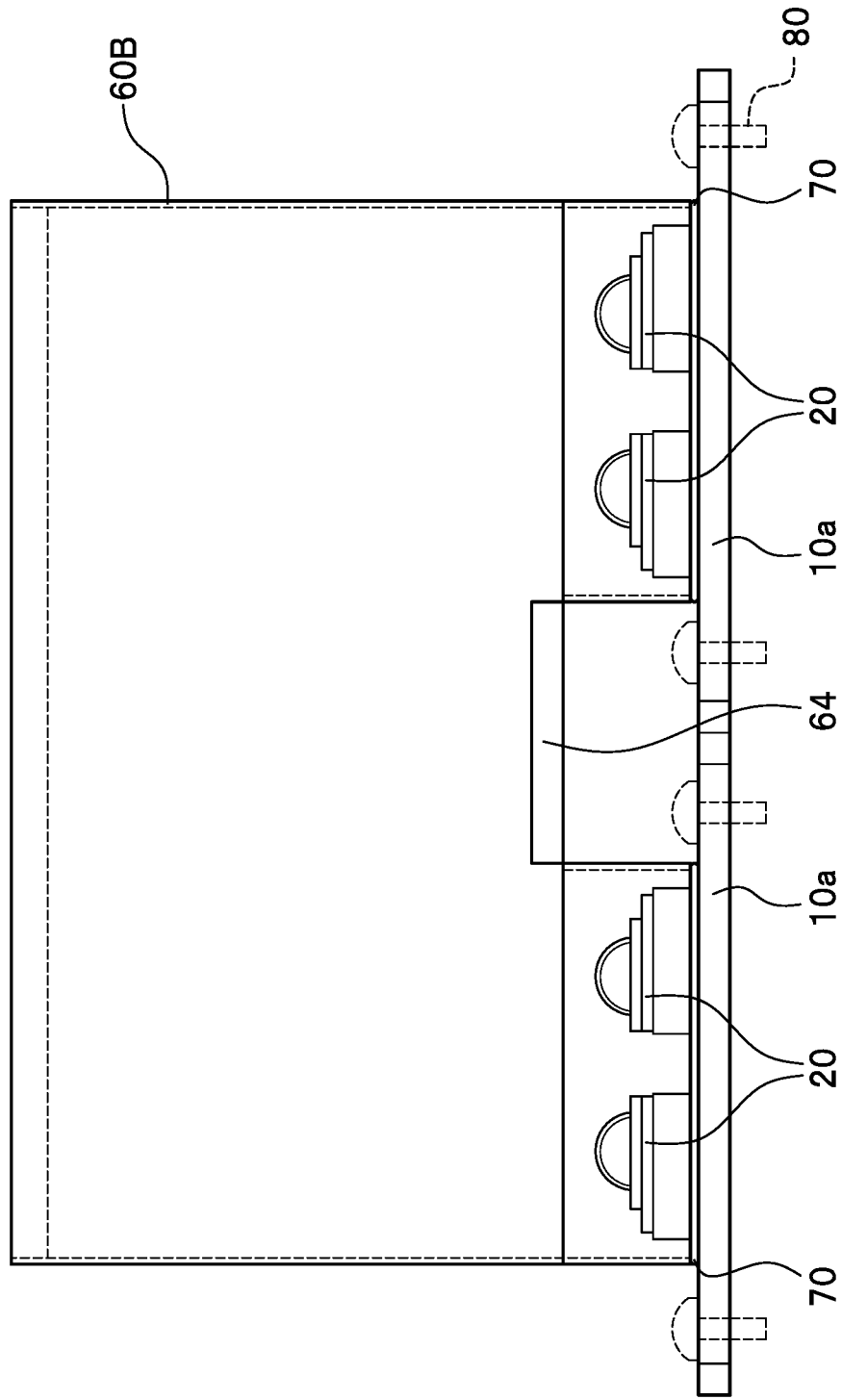
FIG. 12B is a side view schematically showing an exemplary configuration of the projector according to the embodiment shown in FIG. 12A.
Figure 13:
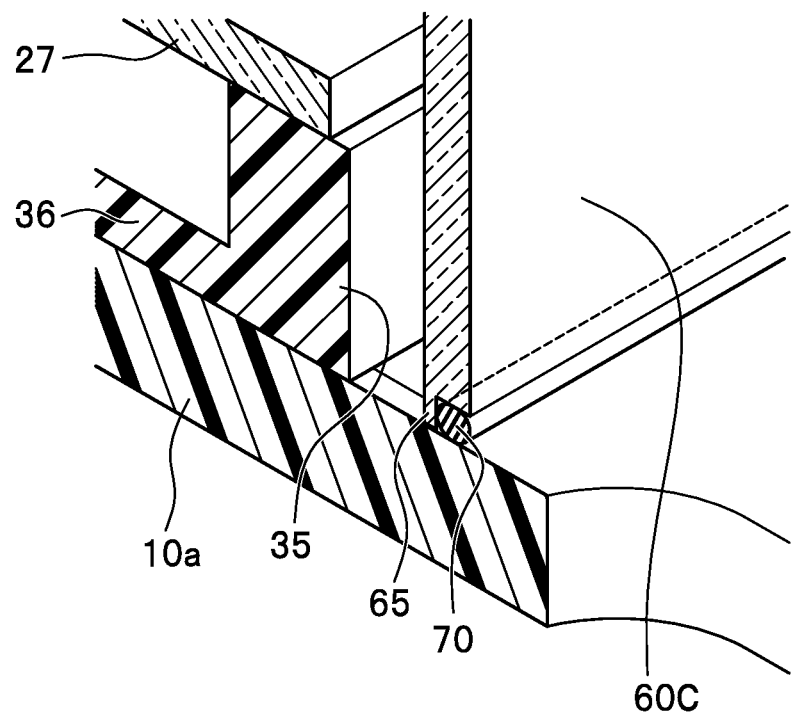
FIG. 13 is a perspective cross-sectional view for illustrating other sealing structure of the light emitting module according to certain embodiment.

FIG. 10A is a perspective view schematically showing an exemplary application of a light emitting module according to certain embodiment to a projector. FIG. 10B is a perspective cross-sectional view for illustrating a sealing structure of the light emitting module according to certain embodiment. FIG. 11A is a perspective view schematically showing an exemplary application of the light emitting module according to an embodiment to a projector. FIG. 11B is a plan view schematically showing an exemplary configuration of the projector according to the embodiment shown in FIG. 11A. FIG. 11C is a side view schematically showing an exemplary configuration of the projector according to the embodiment shown in FIG. 11A. FIG. 12A is a perspective view schematically showing an exemplary application of a light emitting module according to certain embodiment to a projector. FIG. 12B is a side view schematically showing an exemplary configuration of the projector according to the embodiment shown in FIG. 12A. FIG. 13 is a perspective cross-sectional view for illustrating other sealing structure of a light emitting module according to an embodiment.

In the drawings, for the sake of convenience, the projector is partially seen through as appropriate.

As shown in FIGS. 10A and 10B, a projector 200 includes a hermetic-sealing member 60.

The hermetic-sealing member 60 forms hermetically sealed space around the light emitting devices 20 mounted on the mounting substrate 10 in the light emitting module. Inside the hermetically sealed space, an optical system of the projector is mounted. That is, an optical unit for generating a projection image that the projector projects is mounted. The optical unit can include, for example, a lens, a mirror, a DMD (i.e., Digital Mirror Device), a prism and the like. The optical unit can further include other elements such as a liquid crystal panel, a phosphor wheel, a rod integrator and the like. Alternatively, the optical unit can be formed of appropriate ones of these elements. Accordingly, an appropriate optical system can be designed. The projection image generated by the optical unit is emitted to the outside through the hermetic-sealing member 60, and projected on the screen of the projector. In order to inhibit a reduction in the output of the projector due to optical dust collection, preferably all the components forming the optical unit are housed in the hermetically sealed space formed by the hermetic-sealing member 60 and the mounting substrate 10. When the hermetic-sealing member 60 is desired to be downsized, only part of the components forming the optical unit can be housed in the hermetically sealed space.

In the projector 200, a light emitting module including one first mounting substrate 10a equipped with two light emitting devices 20 is covered with the hermetic-sealing member 60. The hermetic-sealing member 60 has a rectangular prism shape in the present mounting example, the shape of the hermetic-sealing member 60 is not particularly specified. That is, the hermetic-sealing member 60 can have a shape corresponding to the shape of the designed optical unit.

On the first mounting substrate 10a, a sealing member 70 provided around each light emitting device 20 to surround the two light emitting devices 20 is provided. The sealing member 70 is provided between the first metal films 12 and the second metal films 13 so that the second metal films 13 are positioned outside the hermetically sealed space. Thus, the light emitting devices 20 can be easily connected to the external power supply. The sealing member 70 is provided inward of the through holes provided on the opposite sides so that the through holes of the first mounting substrate 10a are provided outside the hermetically sealed space. This can eliminates the necessity of taking into consideration of the influence of the through holes in forming the hermetically sealed space. The hermetic-sealing member 60 is bonded to the first mounting substrate 10a with the sealing member 70, to form the hermetically sealed space. This can inhibit entry of any substance that invites optical dust collection, such as dust, outgas of resin, an organic component of grease, into the hermetic-sealing member 60.

The material of the hermetic-sealing member 60 can be, for example, metal, glass, sapphire or the like. In the hermetic-sealing member 60, the area from which light exits to the outside should be formed of light-transmissive member such as glass or sapphire.

The material of the sealing member 70 can be, for example, metal, resin, or rubber. The material of the sealing member 70 can be a material which is easily deformable when pressed, such as a foam, clay or the like. In the case in which the sealing member 70 is formed of metal, a sufficient distance is preferably provided between the sealing member 70 and the first metal films 12 positioned on the far side from the second metal films 13 so as to avoid contact between them. Thus, short-circuiting caused by the sealing member 70 can be avoided. In the case in which the sealing member 70 is formed of an insulating material, the sealing member 70 would not be brought into electrical conduction upon any contact with the first metal films 12 or the second metal films 13.

A projector 200A shown in FIGS. 11A, 11B, and 11C includes a hermetic-sealing member 60A.

In the projector 200A, a light emitting module including two first mounting substrates 10a equipped with four light emitting devices 20 in total, and the hermetic-sealing member 60A covers the light emitting modules 20. The sealing member 70 is formed so as to be around two light emitting devices 20 for each first mounting substrate 10a.

The hermetic-sealing member 60A includes a projecting first pressing part 63 on the boundary between one of the first mounting substrates 10a and the other one of the first mounting substrates 10a. The first pressing part 63 holds down the sealing member 70 provided along the boundary in each first mounting substrate 10a and closes the boundary of the two first mounting substrates 10a. In the case in which two first mounting substrates 10a are bonded to each other at the boundary, no first pressing part 63 can be provided. For example, the mounting substrates has a dimensional tolerance, and thus the two first mounting substrates 10a can be next to each other while being spaced apart from each other, instead of being bonded to each other to form the mounting substrate 10. If the first mounting substrates 10a are spaced apart from each other with a large distance, the size of the light emitting module or the projector increases. Therefore, if downsizing is desired, the interval should be reduced. For example, an interval in a range of 0.1 mm to 1.0 mm is preferably be provided between the two mounting substrates. In other words, the distance from one of the mounting substrates to the other one of the mounting substrates should be in a range of 0.1 mm to 1.0 mm. In the case in which mounting the substrates is performed so as to be spaced from each other, provision of the first pressing part 63 can inhibit entry of external air from the boundary thereby securing hermeticity.

The light emitting modules shown in FIGS. 10A and 11A are described as examples, and the light emitting module 200A can be configured as any one selected from the light emitting modules manufactured through the methods according to the above-described embodiments. That is, any one or two mounting substrate(s) can be selected from the first mounting substrate 10a and the second mounting substrate 10b, to form the light emitting module including the mounting substrate 10. The first light emitting device 20a and the second light emitting device 20b can each be appropriately selected by any number, to be mounted on the mounting substrate 10 to form the light emitting module.

The present disclosure can employ not only a single light emitting module, but also a plurality of light emitting modules.

A projector 200B shown in FIGS. 12A and 12B includes a hermetic-sealing member 60B.

In the projector 200B, two light emitting modules each including two first mounting substrates 10a each equipped with two light emitting devices 20 are provided, and light emitting modules are next to each other. Accordingly, eight light emitting devices 20 in total are covered with the hermetic-sealing member 60B. The sealing member 70 is formed for each first mounting substrate 10a.

In the projector 200B, two mounting substrates 10 are next to each other such that their respective through holes are positioned adjacent to each other.

In addition to the first pressing part 63, the hermetic-sealing member 60B includes a projecting second pressing part 64 straddling the through holes of the two mounting substrates 10. The second pressing part 64 holds down the sealing member 70 provided on the two mounting substrates 10, to form hermetically sealed space. Fixing screws 80 for fixing the mounting substrates 10 to the heat dissipating plate are inserted through the through holes, whereby the mounting substrates 10 are fixed. Provision of the second pressing part 64 can inhibit entry of external air from the through holes and secures hermeticity of the hermetically sealed space.

FIG. 13 shows other exemplary sealing structure of the hermetic-sealing member and the sealing member. In this manner, a hermetic-sealing member 60C can include a projection 65 bonded at its lateral surface and its lower surface to the sealing member 70. The projection 65 covers the lateral surface of the sealing member 70 on the light emitting device 20 side. By the hermetic-sealing member 60C including the projection 65, the position bonded to the sealing member 70 becomes a claw-like shape. This structure can improve adhesion between the hermetic-sealing member 60C and the sealing member 70, contributing to improving hermeticity of the hermetic-sealing member 60C.

What is claimed is:

1. A light emitting module comprising:
    a first light emitting device comprising:
        a first package,
        a plurality of first semiconductor laser elements mounted in the first package, and
        a first lens member having lens portions, wherein a quantity of the lens portions is the same as a quantity of the first semiconductor laser elements mounted in the first package; and
    a second light emitting device comprising:
        a second package,
        a plurality of second semiconductor laser elements mounted in the second package, wherein a quantity of the second semiconductor laser elements mounted in the second package is fewer than the quantity of the first semiconductor laser elements mounted in the first package, and
        a second lens member which is structured the same as the first lens member, such that a quantity of the lens portions in the second lens member is the same as the quantity of the lens portions in the first lens member and greater than the quantity of the second semiconductor laser elements mounted in the second package; and
    one or more mounting substrates on which the first light emitting device and the second light emitting device are mounted.

2. The light emitting module according to claim 1, wherein the quantity of the second semiconductor laser elements is fewer by one than the quantity of the first semiconductor laser elements.

3. The light emitting module according to claim 1, wherein the quantity of the second semiconductor laser elements is fewer by two than the quantity of the first semiconductor laser elements.

4. The light emitting module according to claim 1, wherein;
the first light emitting device has four of the first semiconductor laser elements mounted in the first package, and the first lens member has four lens portions which is a same quantity as the quantity of the first semiconductor laser elements.

5. The light emitting module according to claim 1, wherein;
the plurality of the second semiconductor laser elements in the second light emitting device are disposed at identical positions to a set of the plurality of the first semiconductor laser elements in the first light emitting device.

6. The light emitting module according to claim 1, wherein the first semiconductor laser element emits the same color light as the second semiconductor laser element.

7. The light emitting module according to claim 1, wherein a shape of the first package is the same as a shape of the second package in a top view.

8. The light emitting module according to claim 7, wherein;
the shape of the first light emitting device and the shape of the second light emitting device are a quadrangular shape in a top view, and a shape of the first lens member and a shape of the second lens member are a quadrangular shape in a top view.

* * * * *